(12) United States Patent
Kanemoto et al.

(10) Patent No.: US 8,192,093 B2
(45) Date of Patent: Jun. 5, 2012

(54) OPTICAL TRANSMISSION MODULE AND MANUFACTURING METHOD THEREOF

(75) Inventors: Mitsunori Kanemoto, Tokyo (JP); Taro Kaneko, Tokyo (JP); Mitsuru Kurihara, Tokyo (JP)

(73) Assignee: NEC Corporation, Tokyo (JP)

( * ) Notice: Subject to any disclaimer, the term of this patent is extended or adjusted under 35 U.S.C. 154(b) by 618 days.

(21) Appl. No.: 12/303,906

(22) PCT Filed: May 30, 2007

(86) PCT No.: PCT/JP2007/060957
§ 371 (c)(1),
(2), (4) Date: Dec. 8, 2008

(87) PCT Pub. No.: WO2007/142089
PCT Pub. Date: Dec. 13, 2007

(65) Prior Publication Data
US 2010/0178012 A1    Jul. 15, 2010

(30) Foreign Application Priority Data
Jun. 8, 2006 (JP) .................. 2006-159855

(51) Int. Cl.
*G02B 6/36* (2006.01)
(52) U.S. Cl. ........................................ 385/88
(58) Field of Classification Search ............ 385/88
See application file for complete search history.

(56) References Cited

U.S. PATENT DOCUMENTS

| | | | |
|---|---|---|---|
| 4,914,667 A | 4/1990 | Blonder et al. | |
| 6,467,972 B2 * | 10/2002 | Setoguchi | 385/88 |
| 2001/0038498 A1 * | 11/2001 | Furuhashi et al. | 359/819 |
| 2003/0081309 A1 | 5/2003 | Nishi et al. | |
| 2003/0086468 A1 | 5/2003 | Kato et al. | |
| 2003/0179799 A1 * | 9/2003 | Chiaretti | 372/92 |

FOREIGN PATENT DOCUMENTS

| | | |
|---|---|---|
| JP | 63-199482 | 8/1988 |
| JP | 05-037025 | 2/1993 |
| JP | 10-254001 | 9/1998 |
| JP | 2000-228556 | 8/2000 |
| JP | 2001-196683 | 7/2001 |
| JP | 2002-374031 | 12/2002 |
| JP | 2003-060296 | 2/2003 |
| JP | 2003-110190 | 4/2003 |
| JP | 2005-150724 | 6/2005 |
| JP | 2005-352230 | 12/2005 |

OTHER PUBLICATIONS

Intel TXX19907, Full C-Band or L-Band Interable Tunable Laser Assembly (ITLA).
Intel TTX11500, Full C-Band or L-Band Tunable Lasers.

* cited by examiner

*Primary Examiner* — Eric Wong
(74) *Attorney, Agent, or Firm* — Young & Thompson

(57) ABSTRACT

An optical transmission module is provided which has excellent long-term reliability, high manufacturing efficiency and a smaller optical output loss and which facilitate its downsizing, weight saving and high integration. The optical transmission module is provided with a first optical device 118 placed on an output side, a second optical device 122 placed on the first optical device 118 aligned with an optical axis of the first optical device 118, a package 111 including the first and second optical devices 118 and 122, and an optical fiber 115 configured to guide light emitted from the first optical device 118 to the outside of the package 111. The first optical device 118 and the second optical device 122 are in close contact with each other on the surface perpendicular to the optical axis.

17 Claims, 19 Drawing Sheets

OPTICAL TRANSMISSION MODULE AND MANUFACTURING METHOD THEREOF

TECHNICAL FIELD

The present invention is related to an optical transmission module used in an optical communication system and the method of manufacturing. Particularly, the present invention is related to an optical transmission module configured to accommodate a plurality of optical devices such as semiconductor lasers or semiconductor optical amplifiers in the same package and the method of manufacturing.

BACKGROUND ART

In recent years, in response to the increase in demand for optical communication services, in a wavelength division multiplexing (WDM) system, many light sources having many wavelengths are required in order to bind 40 to 80 wavelength signals into around 32-nm band of an optical fiber amplifier. Therefore, there was a problem that many backup light sources should be prepared for use during network failure.

Moreover, in order to increase the flexibility of a network, there is an increasing demand to provide the function of changing a route of respective wavelength signals by remote control. From this respect, it is desirable to have a wavelength-variable light source capable of emitting light having wavelength variable over a wide range covering the band of an optical fiber amplifier.

Hitherto, several wavelength-variable light sources capable of satisfying the demand have been implemented: however, all of them had a complex structure and were difficult to mass-produced and expensive. Therefore, it is desirable to implement a wavelength-variable light source suitable for mass production.

An example of a conventional wavelength-variable optical transmission module is disclosed in Non-Patent Document 1 or 2. The optical transmission module disclosed in the Non-Patent Documents has a structure called an external cavity type.

Another example of the conventional wavelength variable optical transmission module includes "Laser Module" disclosed in Patent Document 1, "Multi-Channel Light Source and Multi-Channel Optical Module Using the Same" disclosed in Patent Document 2, "Optical Module" disclosed in Patent Document 3, and the like.

Patent Document 1:
Japanese Patent Application Laid-Open (JP-A) No. 2003-110190
Patent Document 2: JP-A No. 2005-150724
Patent Document 3: JP-A No. 2005-352230
Non-Patent Document 1:
http://download.intel.com/design/network/ProdBrf/30081902.pdf
Non-Patent Document 2:
http://download.intel.com/design/network/products/optical/prodbrf/30664 501.pdf

DISCLOSURE OF THE INVENTION

Problem to be Solved by the Invention

However, the optical transmission module disclosed in Non-Patent Document 1 or 2 has the following problems.

First, the rigidity thereof in the optical axis direction is small and the optical axis is likely to be misaligned. This is because the external cavity structure itself uses a number of optical components such as mirrors and thus becomes complicated, the optical transmission module becomes long.

Second, the optical transmission module cannot be manufactured at a low cost and the manufacturing efficiency is poor. This is because the number of components is large, the number of manufacturing steps becomes large and thus the manufacturing cost increases.

Third, the optical transmission unit is difficult to achieve downsizing, weight saving and high integration. This is because the number of components is large, a large space is required for installing them.

Fourth, the optical output loss is large. This is because a number of optical components such as mirrors are used, which causes light attenuates when the emitting light passes through the optical components and blurring defects to occur.

Moreover, in the inventions disclosed in Patent Documents 1 to 3, since two optical devices aren't in close contact with each other, the optical axes of the two optical devices are more likely to be misaligned, the optical transmission module has poor long-term reliability, e.g., in terms of shock resistance and thermal shock resistance. Furthermore, since a material having good thermal conductivity is not used as a material for controlling the temperature of the two optical devices, heat transmitting properties and thermal properties are poor.

The present invention has been taken into consideration the problems noted above, and its aim is to provide an optical transmission module and the method of production, which have excellent long-term reliability, high manufacturing efficiency and a smaller optical output loss and which facilitate its downsizing, weight saving and high integration.

Means for Solving the Problems

In order to attain the object, according to a first aspect of the present invention, there is provided an optical transmission module including: a first optical device placed on an output side; a second optical device placed on the first optical device, aligned with an optical axis of the first optical device; a package including the first and second optical devices; and a light guiding instrument that guides light emitted from the first optical device to the outside of the package, The optical transmission module is characterized by the first optical device and the second optical device in close contact with each other on a surface perpendicular to the optical axis.

In the first aspect of the present invention, it is preferable that the first optical device is in close contact with the first carrier via a first sub-carrier; the second optical device is in close contact with a second carrier; and the first carrier is in close contact with the second carrier on, a surface perpendicular to the optical axis. In addition to this, it is more preferable that the first and second carriers are fixed on the peltier element, or on each peltier element.

In the configuration according to the first aspect of the present invention, where the first and second carriers are provided, it is preferable that thin wall portions are provided for a portion of the second carrier in close contact with the first carrier. In addition to this, it is more preferable that the fixing the first carrier on the second carrier is made on the thin wall portions. Furthermore it is preferable that an opening or concave to form the thin wall portions are provided for the second carrier.

In above configuration according to the first aspect of the present invention, where the first and second carriers are provided, it is preferable that fixing the first carrier on the second carrier is carried out by welding or by bounding. In addition to this, it is more preferable that fixing the first carrier on the second carrier is carried out by an ultraviolet curable adhesive or by brazing.

In the configuration according to the first aspect of the present invention, where the first and second carriers are provided, it is preferable that the first carrier and the second carrier are fixed on the peltier element or on each peltier element.

In above configuration according to the first aspect of the present invention, it is preferable that the first optical device is a semiconductor optical amplifier to amplify an incident signal light. Moreover, it is preferable that the second optical device is a planar lightwave circuit.

In order to attain the object, according to a second aspect of the present invention, there is provided a method of manufacturing an optical transmission module including: a first optical device placed on an output side; a second optical device placed on the first optical device, aligned with an optical axis of the first optical device; a package including the first and second optical devices; and a light guiding instrument that guides light emitted from the first optical device to the outside of the package, The optical transmission module is characterized by the first optical device and the second optical device in close contact with each other on a surface perpendicular to the optical axis.

In the second aspect of the present invention, it is preferable that the first and second optical devices are simultaneously welded to each other at least four points in total at symmetric positions about the optical axis on the surface to perpendicular to the optical axis so that the first optical device and the second optical device are in close contact with each other. Moreover, it is preferable that the first and second optical devices are simultaneously welded to each other at two points at symmetric positions about the optical axis on the surface to perpendicular to the optical axis.

In the second aspect of the present invention, it is preferable that the first and second optical devices are bonded to each other on symmetric areas about the optical axis on the surface to perpendicular to the optical axis so that the first optical device and the second optical device are fixed to each other.

In addition, in the second aspect of the present invention, it is preferable that the first and second optical devices are brazed to each other on symmetric areas about the optical axis on the surface to perpendicular to the optical axis so that the first optical device and the second optical device are fixed to each other.

In above configuration according to the second aspect of the present invention, it is preferable that the first and second optical device are fixed to each other with the first optical device pressing the second optical device.

Effect of the Invention

According to the various aspects of the present invention, it is possible to provide an optical transmission module and the method of production, which have excellent long-term reliability, high manufacturing efficiency and a smaller optical output loss and which facilitate its downsizing, weight saving and high integration.

BEST MODE FOR CARRYING OUT THE INVENTION

First Exemplary Embodiment

Hereinafter, the description of a first exemplary embodiment in which the present invention is preferably embodied will be provided. FIG. 1 is a cross-sectional view of an optical transmission module according to the present embodiment. FIG. 2 is a perspective view of an optical transmission unit according to the present embodiment.

An optical transmission module 1 includes a package 111, a peltier element 112, an optical transmission unit 2, a fiber support 113, a ferrule 114, an optical fiber 115, and a coupling lens 116.

The peltier element 112 is placed in the package 111 so as to control the temperature of the optical transmission unit 2. The optical transmission unit 2 is placed on the peltier element 112. The fiber support 113 is attached to an opening portion of the package 111. The ferrule 114 is supported by the fiber support 113. The optical fiber 115 is held by the ferrule 114. The coupling lens 116 is placed at a distal end of the ferrule 114.

The optical transmission unit 2 includes a first carrier 117, a first optical device 118, a first sub-carrier 119, a lens 120, a second carrier 121, and a second optical device 122.

The first carrier 117 composes a portion of a base. The first optical device 118 is placed on the first carrier 117 via the first sub-carrier 119. The lens 120 is fixed on the first carrier 117. The second carrier 121 composes a portion of the base. The second optical device 122 is fixed on the second carrier 121.

In the optical transmission module 1, a signal light emitted from the first optical device 118 passes through the second optical device 122. The light is adjusted by the second optical device 122 and then returns back to the first optical device 118 so that the returning light is amplified. The amplified light passes through the coupling lens 116 via the lens 120 to be incident on the optical fiber 115. The peltier element 112 is configured to maintain the temperature of the first optical device 118 and the second optical device 122 to be within a predetermined range.

The first optical device 118 is die-bonded, e.g., by using AuSn solder, to the first sub-carrier 119. The first sub-carrier 119 is die-bonded, e.g., by using AuSn solder, to the first carrier 117.

The lens 120 is fixed on the first carrier 117 by means of bonding and the like.

The second optical device 122 is die-bonded to the second carrier 121 by using AuSn solder.

A first optical device unit 3 is configured by the first sub-carrier 119, the first optical device 118 and the lens 120.

A second optical device unit 4 is configured by the second carrier 121 and the second optical device 122.

The first optical device unit 3 and the second optical device unit 4 are fixed to each other on the surface perpendicular to an optical axis of the first carrier 117 and the surface perpendicular to an optical axis of the second carrier 121 respectively for instance by using an ultraviolet curable adhesive.

An ultraviolet irradiation condition when the first optical device unit 3 is fixed on the second optical device unit 4 is preferably optimized by preliminarily experiments, The condition refers to an irradiation distance, an irradiation period, and an output distribution capable of obtaining sufficient welding strength and minimizing positional misalignment when they are bonded to each other. Moreover, in order to suppress the contractive force of the adhesive generated during the fixing as much as possible (that is, to suppress the misalignment due to the bonding as much as possible), the irradiation strength is most preferably set to a minimum output within a range where the fixing can be carried out while the irradiation period is most preferably set to a minimum period during which the bonding can be carried out. Furthermore, in order to realize the bonding by reducing the irradiation strength and the irradiation period, it may be effective to decrease the thickness of a bonding portion. In addition, the output distribution of the ultraviolet rays is preferably controlled to gradually decrease with time in order to suppress the occurrence of residual stress or positional misalignment in response to an abrupt change in the contractive force of the adhesive. The residual stress has a great influence on reliability. Since the ultraviolet irradiation condition greatly depends on the shape and condition of the bonding portion, it is preferable to optimize the ultraviolet irradiation condition from the positional misalignment and the bonding strength by examining the ultraviolet irradiation condition that depends on the shapes of the bonding portion.

Moreover, in order to ensure long-term reliability and bonding strength by certainly curing the adhesive and to ensure the thermal properties as the optical transmission module, it is preferable to use a material having good thermal conductivity and ultraviolet transmitting properties for the material of the second carrier 121. One of the examples is a material include aluminum nitride-based translucent ceramics. Furthermore, as illustrated in FIG. 3, the second carrier 121 is preferably made of a composite material containing a plurality of materials such that a portion (a ultraviolet irradiation portion) 41 on which ultraviolet rays are irradiated is made of a material (e.g., glass) having excellent ultraviolet transmittance while the other portion (a ultraviolet non-irradiation portion) 42 is made of a material (e.g., copper tungsten or aluminum nitride) having good thermal conductivity.

On the other hand, as a material of the first carrier 117, it is preferable to use a material having high thermal conductivity, i.e., copper tungsten or aluminum nitride in order to ensure the thermal properties as the optical transmission module 2. Moreover, it is preferable to apply a surface treatment, such as gold plating on the surface fixed on the second carrier 121 in order to improve the effect of reflecting ultraviolet rays.

That is, a material having high ultraviolet transmittance is used for portions where ultraviolet rays are irradiated. A material having high thermal conductivity is used on the right below elements, such as the first optical device 118 or the second optical device 122, requiring temperature control. Moreover, in order to increase ultraviolet irradiation efficiency, it is important to have the other surface of the bonding surface made of a material having high ultraviolet transmittance using a material having high ultraviolet reflection efficiency or applying a surface treatment to increase ultraviolet reflection efficiency thereto.

In addition, the fixing the first optical device unit 3 on the second optical device unit 4 may be carried out by means of other adhesives as well as the ultraviolet curable adhesive or by any method such as YAG laser welding or brazing.

In the case of welding, the first and second optical devices 118 and 122 are simultaneously welded to each other at least four points in total at symmetric positions about the optical axis on the surface to perpendicular to the optical axis so that the first and second optical devices 118 and 122 are fixed to each other, or the first and second optical devices 118 and 122 are simultaneously welded to each other at two points at symmetric positions about the optical axis on the surface to perpendicular to the optical axis so that the influence of the positional misalignment accompanied by the welding is suppressed as much as possible.

In either case of using the bonding, the welding, or the brazing, the optical devices are fixed to each other with the first carrier 118 pressing the second carrier 122.

The description of a method of assembling the optical transmission module according to the present embodiment will be provided.

First, the first optical device unit 3 including the first optical device 118 is assembled. The first sub-carrier 119 is die-bonded to the first carrier 117 by means of AuSn solder, and then, the first optical device 118 is die-bonded on the first sub-carrier 119 by means of AuSn solder with high precision in the optical axis direction to be fixed thereto. Thereafter, the position of the lens 120 on the first carrier 117 adjusted.

The position adjustment of the lens 120 is carried out such that the first optical device 118 is made to emit light and the position of the lens 120 is then adjusted so that the light output becomes the maximum while seeing a monitor connected to an infrared visual camera placed at a position to which the light from the lens 120 is to be emitted, and the lens 120 is fixed on the first carrier 117 by bonding and the like.

In this way, the first optical device unit 3 including the first optical device 118 is completed.

Next, the second optical device unit 4 including the second optical device 122 is assembled. The second optical device 122 is the bonded on the second carrier 121 by means of AuSn solder with high precision in the optical axis direction to be fixed thereto.

Next, the description of a method of fixing the first optical device unit 3 on the second optical device unit 4 to each other will be provided. As illustrated in FIG. 4(a), the first optical device unit 3 and the second optical device unit 4 are in close contact with each other on respective surfaces perpendicular to their optical axes, and optical axis alignment is then performed by moving the second optical device unit 4 in the X and Y directions with the second optical device unit 4 being grasped by a grasping tool 32. That is, the position of the second optical device unit 4 is adjusted such that the first optical device 118 is made to emit light so that the light output from the first optical device 118 becomes the maximum by observing with a non-illustrated power meter via a fiber coupling lens 34 and an optical fiber 33. During the adjustment, the pressing force toward the second carrier 121 by a pusher 35 is gradually increased. The pressing of the second carrier 121 by the pusher 35 is made at three pressing areas 35a as illustrated in FIG. 5. At this time, the centroid of pressing is made to be identical with the optical axis as much as possible (ideally, identical with the optical axis). Moreover, when the pressing force toward the second carrier 121 is gradually increased, the respective forces at the three areas are controlled to be well-balanced so that the optical axes are not misaligned. Thereafter, the grasping of the second optical device unit 4 by the grasping tool 32 is released in a state where the second carrier 121 is pressed by the pusher 35, and bonding is performed (FIG. 4(b)). This bonding is carried out by bonding portions 45a and 45b placed symmetric to the optical axis. By curing these two areas at the same time and with the same condition, it is possible to control the contractive force of the adhesive generated during curing in a well-balanced manner and to thus suppress the positional or angular misalignment accompanied by the bonding as much as possible.

The distances "a" and "b", which are distances from a perpendicular line passing the optical axis of the bonding portions are set to satisfy a relationship of a=b. These bonding portions are formed in an opening portion (a gap between the first carrier 117 and the second carrier 121) illustrated in FIGS. 6(a) and 6(b).

The bonding surfaces of the first carrier 117 and the second carrier 121 are formed into such shapes as shown in FIGS. 7(a) to 7(c) so that positional misalignment of the distances in the optical axis direction does not occur in the first optical device 118 and the second optical device 122 in response to a change in the thickness of the coated adhesive. The first carrier 17 and the second carrier 21 are firmly fixed to each other on the surfaces thereof perpendicular to the optical axes with the adhesive coated portions as about 5-μm step, so that the positional misalignment in the optical axis direction of the first optical device 118 and the second optical device 122 is suppressed.

In addition, about 5-μm step portion (hatched portions in the leftmost figures of FIGS. 7(b) and 7(c)) at the center of the first carrier 117 is coated with an adhesive and is then cured to increase the bonding strength.

Moreover, a groove having the width of 0.5 mm and the depth of 0.1 mm is formed in the first carrier 117 so that the adhesive does not flow into a portion through which light from the first optical device 118 and the second optical device 122 passes, thereby preventing flow of the adhesive.

After the first optical device unit 3 and the second optical device unit 4 are fixed to each other, they are heated at the predetermined temperature for a predetermined period in order to cure non-cured portions of the adhesive and reduce internal stress. Thereafter, as illustrated in FIG. 1, the first optical device unit 3 and the second optical device unit 4 are fixed on the peltier element 112 in the package 111, and the position of the fiber support 113 is adjusted so that the light output from the optical fiber 115 becomes the maximum while monitoring the light output by connecting the optical fiber 115 to a non-illustrated optical power meter. First, the fiber support 113 is moved in the X and Y directions to adjust the position thereof, and then, the fiber support 113 is fixed to the package 111 by means of YAG laser welding. Subsequently, the ferrule 114 is moved in the Z direction to adjust the position thereof, and then the ferrule 114 is fixed to the fiber support 113 by means of YAG laser welding.

The ultraviolet irradiation condition to the bonding portions described above is optimized by preliminarily experiments. The condition refers to the irradiation strength, the irradiation period, and the output distribution capable of obtaining sufficient welding strength and minimizing positional misalignment when they are bonded to each other.

Alternatively, the fixing the first optical device unit 3 on the second optical device unit 4 may be carried out by means of other adhesives as well as the ultraviolet curable adhesive or by any method such as YAG laser welding or brazing.

In such cases, it may be necessary to consider the component shape and an assembly method of the first carrier 117 and the second carrier 121, for example, specific to a fixing method used.

The description of an example structure of the optical transmission module according to the present embodiment will be described. Referring to FIG. 8, a cross-sectional view of the optical transmission module according to the present embodiment is illustrated. Referring to FIG. 9, a perspective view of the optical transmission unit according to the present embodiment is illustrated.

In the structure described herein, a semiconductor optical amplifier 18 is used as the first optical device, a planar lightwave circuit 22 is used as the second optical device, and a rectangular aspheric lens 20 is used as the lens placed on the first carrier.

The optical transmission module 1 includes a package 11, an optical transmission unit 2, a peltier element 12, a fiber support 13, a ferrule 14, an optical fiber 15, and a coupling lens 16. The peltier element 12 is placed in the package 11 so as to control the temperature of the optical transmission unit 2. The optical transmission unit 2 is placed on the peltier element 12. The fiber support 13 is attached to an opening portion of the package 11. The ferrule 14 is supported by the fiber support 13. The optical fiber 15 is held by the ferrule 14. The coupling lens 16 is placed at a distal end of the ferrule 14.

The optical transmission unit 2 includes a first carrier 17, a semiconductor optical amplifier 18, a first sub-carrier 19, a rectangular aspheric lens 20, a second carrier 21, and a planar lightwave circuit 22. The first carrier 17 composes a portion of a base. The semiconductor optical amplifier 18 is placed on the first carrier 17 via the first sub-carrier 19. The rectangular aspheric lens 20 is fixed on the first carrier 17. The second carrier 21 composes a portion of the base. The planar lightwave circuit 22 is fixed on the second carrier 21.

A signal light emitted from the semiconductor optical amplifier 18 passes through the planar lightwave circuit 22. A wavelength of the light is adjusted to a predetermined wavelength by the planar lightwave circuit 22 and then returns back to the semiconductor optical amplifier 18 so that the returning light is amplified. The amplified light passes through the coupling lens 16 via the rectangular aspheric lens 20 to be incident on the optical fiber 15. The peltier element 12 is configured to maintain the temperature of the planar lightwave circuit 22 and the semiconductor optical amplifier 18 to be at the constant temperature.

The semiconductor optical amplifier 18 is die-bonded to the first sub-carrier 19 by means of AuSn solder. Moreover, the first sub-carrier 19 is die-bonded to the first carrier 17 by means of AuSn solder.

The rectangular aspheric lens 20 is fixed by mounting on the first carrier 20.

The planar lightwave circuit 22 is die-bonded on the second carrier 21 by means of AuSn solder.

The first optical device unit 3 is configured by the first sub-carrier 19, the semiconductor optical amplifier 18, and the rectangular aspheric lens 20.

The second optical device unit 4 is configured by the second carrier 21 and the planar lightwave circuit 22.

The first optical device unit 3 and the second optical device unit 4 are fixed to each other on the surface perpendicular to an optical axis of the first carrier 17 and the surface perpendicular to an optical axis of the second carrier 21 respectively for instance by using an ultraviolet curable adhesive.

An ultraviolet irradiation condition at the time of fixing the first optical device unit 3 and the second optical device unit 4 is optimized by preliminarily experiments, the condition refers to the irradiation strength; the irradiation period, and the output distribution capable of obtaining sufficient welding strength and minimizing positional misalignment when they are bonded to each other.

In order to realize the bonding by reducing the irradiation strength and the irradiation period, the thickness of a bonding portion is made thin. In addition, the output distribution of the ultraviolet rays is controlled to gradually decrease with time in order to suppress the occurrence of residual stress or positional misalignment in response to an abrupt change in the contractive force of the adhesive. Since the ultraviolet irradiation condition greatly depends on the shape and condition of the bonding portion, the ultraviolet irradiation condition is optimized from the positional misalignment and the bonding strength by examining the ultraviolet irradiation condition that depends on the shapes of the bonding portion.

Moreover, in order to ensure long-term reliability and bonding strength by certainly curing the adhesive and to ensure the thermal properties as the optical transmission module, the second carrier 21 is made of aluminum nitride-based translucent ceramics having good thermal conductivity and ultraviolet transmitting properties.

On the other hand, as a material of the first carrier 17, a material having high thermal conductivity, i.e., copper tungsten or aluminum nitride is used in order to ensure the thermal properties as the optical transmission module 2. Moreover, a surface treatment, such as gold plating is applied to the surface thereof bonded to the second carrier 21 in order to improve the effect of reflecting ultraviolet rays and increase the ultraviolet irradiation efficiency.

Moreover, as illustrated in FIG. 5, thin wall portions are provided for the second carrier 21 so that ultraviolet transmittance of the bonding portions 45a and 45b to which ultraviolet rays are irradiated is further increased. The thin wall portions are designed into the thickness of 0.2 mm and the length of 0.5 mm considering the mechanical processing limitation and the strength of the thin wall portions.

The bonding surface of the first carrier 17 or the second carrier 21 is formed into such a shape as shown in FIGS. 7(a) to 7(c) so that positional misalignment in the optical axis direction does not occur in the semiconductor optical amplifier 18 and the planar lightwave circuit 22 in response to a change in the thickness of the coated adhesive. The first carrier 17 and the second carrier 21 are firmly fixed to each other on the surfaces thereof perpendicular to the optical axes with the adhesive coated portions as about 5-μm step, so that the positional misalignment in the optical axis direction of the semiconductor optical amplifier 18 and the planar lightwave circuit 22 is suppressed.

In addition, about 5-μm step portion (hatched portions in the leftmost figures of FIGS. 7(b) and 7(c)) at the center of the first carrier is coated with an adhesive and is then cured to increase the bonding strength.

Moreover, a groove having the width of 0.5 mm and the depth of 0.1 mm is formed in the first carrier 17 so that the adhesive does not flow into a portion through which light from the semiconductor optical amplifier 18 and the planar lightwave circuit 22 passes, thereby preventing flow of the adhesive.

Next, the description of an assembly method will be provided.

First, the first sub-carrier 19 is die-bonded to the first carrier 17 by means of AuSn solder, and then, the semiconductor optical amplifier 18 is die-bonded, on the first sub-carrier 19 by means of AuSn solder with high precision (in micrometer order) in the optical axis direction to be fixed thereto. Thereafter, the position of the rectangular aspheric lens 20 with respect to the first carrier 17 is adjusted. The position adjustment of the rectangular aspheric lens 20 is carried out such that the semiconductor optical amplifier 18 is made to emit light and the position of the rectangular aspheric lens 20 is then adjusted so that the light output becomes the maximum while seeing a monitor connected to an infrared visual camera installed at a position to which the light from the rectangular aspheric lens 20 is to be emitted. After completion of the adjustment, the rectangular aspheric lens 20 is fixed on the first carrier 17 by bonding.

Next, the planar lightwave circuit 22 is die-bonded on the second carrier 21 by means of AuSn solder with high precision (in micrometer order) in the optical axis direction to be fixed thereto.

As illustrated in FIG. 4(a), the first optical device unit 3 and the second optical device unit 4 are in close contact with each other on respective surfaces perpendicular to their optical axes, and optical axis alignment is then performed by moving the second optical device unit 4 in the X and Y directions with the second optical device unit 4 being grasped by a grasping tool 32. The optical axis alignment is carried out such that the semiconductor optical amplifier 18 is made to emit light and the position is then adjusted to an optimum position so that the light output of a wavelength resonated at the planar lightwave circuit 22 from the semiconductor optical amplifier 18 becomes the maximum by observing with a non-illustrated power meter via a fiber coupling lens 34 and an optical fiber 33.

During the adjustment, the pressing force toward the second carrier 21 by a pusher 35 is gradually increased. The pressing of the second carrier 21 by the pusher 35 is made at three pressing areas 35a as illustrated in FIG. 5. At this time, the centroid of pressing is made to be identical with the optical axis as much as possible.

Moreover, when the pressing force toward the second carrier 21 is gradually increased, the respective forces at the three areas are controlled to be well-balanced so that the optical axes are not misaligned. Thereafter, the grasping of the second optical device unit 4 by the grasping tool 32 is released in a state where the second carrier 21 is pressed by the pusher 35, and bonding is performed (similar to FIG. 4(b)). This bonding is carried out by bonding portions 45a and 45b placed symmetric to the optical axis, as illustrated in FIG. 5. By curing these two areas at the same time and with the same condition, it is possible to control the contractive force of the adhesive generated during curing in a well-balanced manner and to thus suppress the positional or angular misalignment accompanied by the bonding as much as possible. In order for this, the distances "a" and "b", which are distances from a perpendicular line passing the optical axis of the bonding portions are set to satisfy a relationship of a=b. These bonding portions are formed in an opening portion (a gap between the first carrier 17 and the second carrier 21) similar to the structure illustrated in FIGS. 6(a) and 6(b).

The bonding surface of the first carrier 17 or the second carrier 21 is formed into such a shape as shown in FIGS. 7(a) to 7(c) so that positional misalignment in the optical axis direction does not occur in the semiconductor optical amplifier 18 and the planar lightwave circuit 22 in response to a change in the thickness of the coated adhesive. The first carrier 17 and the second carrier 21 are firmly fixed to each other on the surfaces thereof perpendicular to the optical axes with the adhesive coated portions as about 5-μm step, so that the positional misalignment in the optical axis direction of the semiconductor optical amplifier 18 and the planar lightwave circuit 22 is suppressed.

In addition, about 5-μm step portion at the center of the first carrier 17 is coated with an adhesive and is then cured to increase the bonding strength.

Moreover, a groove having the width of 0.5 mm and the depth of 0.1 mm is formed in the first carrier 17 so that the adhesive does not flow into a portion through which light from the semiconductor optical amplifier 18 and the planar lightwave circuit 22 passes, thereby preventing flow of the adhesive.

After the first optical device unit 3 and the second optical device unit 4 are fixed by ultraviolet irradiation to each other, they are heated at the temperature of 85° C. for two hours in order to cure non-cured portions of the adhesive and reduce internal stress.

Thereafter, as illustrated in FIG. 8, the first optical device unit 3 and the second optical device unit 4 are fixed on the peltier element 12 in the package 11, and the position is adjusted so that the light output from the optical fiber 15 becomes the maximum while monitoring the light output by connecting the optical fiber 15 to a non-illustrated optical power meter.

First, the fiber support 13 is moved in the X and Y directions to adjust the position thereof, and then, the fiber support 13 is fixed to the package 11 by means of YAG laser welding. Subsequently, the ferrule 14 is moved in the Z direction to adjust the position thereof, and then the ferrule 14 is fixed to the fiber support 13 by means of YAG laser welding. The ultraviolet irradiation condition to the bonding portions described above is optimized by preliminarily experiments. The condition refers to the irradiation strength, the irradiation period, and the output distribution capable of obtaining sufficient welding strength and minimizing positional misalignment when they are bonded to each other.

The optical transmission module produced in such a manner exhibits a high rigidity in the optical axis direction and the optical axis is not likely to be misaligned. This is because the external cavity structure itself can be realized by the planar lightwave circuit, and accordingly, the length of the optical transmission module can be decreased, and as a result, the rigidity in the optical axis direction is increased mechanically.

Moreover, the optical transmission module can be manufactured at a low cost, the manufacturing efficiency can be improved, and thus, the manufacturing yield can be improved. This is because the number of components can be suppressed to the minimum, and as a result, the number of manufacturing steps can be reduced and thus the manufacturing cost can be decreased.

Furthermore, the optical transmission unit can facilitate its downsizing, weight saving and high integration. This is because the number of components can be suppressed to the minimum, and thus, a space required for installing them can be reduced.

In addition, the optical output loss can be suppressed to the minimum. This is because a least number of optical components such as mirrors are used, which causes light attenuation when the emitting light passes through the optical components and blurring defects being suppressed to the minimum to occur.

Second Exemplary Embodiment

The description of a second exemplary embodiment in which the present invention is preferably embodied will be provided. FIG. 10 is a cross-sectional view of an optical transmission module according to the present embodiment. FIG. 11 is a perspective view of an optical transmission unit according to the present embodiment.

The optical transmission module according to the present embodiment is different from that of the first exemplary embodiment, in that the peltier element is divided into two parts, which are fixed to the first carrier 117 and the second carrier 121, respectively.

By employing such a configuration, it is possible to provide the following advantages:

(1) The temperature of the first optical device unit 3 and the second optical device unit 4 can be controlled individually; and (2) A difference in the height of the bottom surfaces of the first optical device unit 3 and the second optical device unit 4 can be absorbed by the peltier element 112 and the peltier element 112*a*, respectively.

Other configurations are the same as those of the first exemplary embodiment, and therefore, the overlapped descriptions thereof are omitted.

The description of an example structure of the optical transmission module according to the present embodiment will be described. In the structure described herein, a semiconductor optical amplifier 18 is used as the first optical device, a planar lightwave circuit 22 is used as the second optical device, a rectangular aspheric lens 20 is used as the lens placed on the first carrier, and the peltier element is divided into two parts.

By dividing the peltier element, the temperature of the first optical device unit 3 and the second optical device unit 4 can be controlled individually. Moreover, the difference in the height of the bottom surfaces of the first optical device unit 3 and the second optical device unit 4 can be absorbed by the divided peltier elements 12 and 12*a*, respectively.

Third Exemplary Embodiment

The description of a third exemplary embodiment in which the present invention is preferably embodied will be provided. FIG. 12 is a cross-sectional view of an optical transmission module according to the present embodiment. FIG. 13 is a perspective view of an optical transmission unit according to the present embodiment.

The optical transmission module according to the present embodiment has substantially the same configuration as the optical transmission module according to the second exemplary embodiment, except that an area of the contact surface between the first carrier 117 and the second carrier 121 is increased.

By employing such a configuration, in addition to the advantages of the second exemplary embodiment, it is possible to provide the following advantages:

(1) Since the area of the bonding surface between the first carrier 117 and the second carrier 121 can be increased, bonding strength can be increased;

(2) It is possible to provide improved stability when the second carrier 121 is pressed by the pusher 35; and (3) It is possible to smoothly perform alignment of the optical axes between the first optical device 118 and the second optical device 122.

Other configurations are the same as those of the second exemplary embodiment, and therefore, the overlapped descriptions thereof are omitted.

The description of an example structure of the optical transmission module according to the present embodiment will be described. In the structure described herein, a semiconductor optical amplifier 18 is used as the first optical device, a planar lightwave circuit 22 is used as the second optical device, a rectangular aspheric lens 20 is used as the lens placed on the first carrier, and the peltier element is divided into two parts.

Compared with the example configuration shown with respect to the second exemplary embodiment, since the area of the contact surface between the first optical device unit 3 and the second optical device unit 4 is increased, it is therefore possible to increase the area of the bonding surface between the first carrier 17 and the second carrier 19, to thereby provide an increased bonding strength. Moreover, it is possible to provide improved stability when the second carrier 21 is pressed by the pusher 35. Furthermore, it is possible to smoothly perform alignment of the optical axes between the semiconductor optical amplifier 18 and the planar lightwave circuit 22.

Fourth Exemplary Embodiment

The description of a fourth exemplary embodiment in which the present invention is preferably embodied will be provided. FIG. 14 is a perspective view of an optical transmission unit according to the present embodiment.

The optical transmission unit according to the present embodiment has substantially the same configuration as the optical transmission unit according to the first exemplary embodiment, except that an area of the bonding surface between the first carrier 117 and the second carrier 121 is increased on an upper side of the optical transmission unit.

The description of an example structure of the optical transmission module according to the present embodiment will be described.

Since the bonding surface between the first carrier 17 and the second carrier 21 is extended toward an upper side of the optical transmission module 2, the area of the bonding surface between the first carrier 17 and the second carrier 21 can be increased, and it is thus possible to provide an increased bonding strength. Moreover, it is possible to provide further improved stability when the second carrier 21 is pressed by the pusher 35. Furthermore, it is possible to smoothly perform alignment of the optical axes between the semiconductor optical amplifier 18 and the planar lightwave circuit 22.

Fifth Exemplary Embodiment

The description of a fifth exemplary embodiment in which the present invention is preferably embodied will be provided. FIG. 15 is a perspective view of an optical transmission unit according to the present embodiment.

The optical transmission unit according to the present embodiment has substantially the same configuration as the optical transmission unit according to the third exemplary embodiment, except that an area of the bonding surface between the first carrier 117 and the second carrier 121 is increased on both upper and lower sides of the optical transmission module.

The description of an example structure of the optical transmission module according to the present embodiment will be described.

Since the bonding surface between the first carrier 17 and the second carrier 21 is extended toward an upper side of the optical transmission module 2, the area of the bonding surface between the first carrier 17 and the second carrier 21 can be increased, and it is thus possible to provide a further increased bonding strength. Moreover, it is possible to provide improved stability when the second carrier 21 is pressed by the pusher 35. Furthermore, it is possible to further smoothly perform the alignment of the optical axes between the semiconductor optical amplifier 18 and the planar lightwave circuit 22.

Sixth Exemplary Embodiment

The description of a sixth exemplary embodiment in which the present invention is preferably embodied will be provided. FIG. 16 is a perspective view of an optical transmission unit according to the present embodiment.

The optical transmission unit according to the present embodiment has substantially the same configuration as the optical transmission unit according to the first exemplary embodiment, except that the shape serving as a bonding portion is provided for the first carrier 117. Moreover, the peltier element used may be a single peltier element or one which is divided into two parts.

Even with such a configuration, it is possible to provide the same advantage as the first exemplary embodiment or the second exemplary embodiment.

Seventh Exemplary Embodiment

The description of a seventh exemplary embodiment in which the present invention is preferably embodied will be provided. FIG. 17 is a perspective view of an optical transmission unit according to the present embodiment.

The optical transmission unit according to the present embodiment has the contact portion extended toward an upper side thereof similar to the fourth exemplary embodiment but is different from the optical transmission unit according to the fourth exemplary embodiment, in that the shape serving as the bonging portion is provided for the first carrier 117.

Even with such a configuration, it is possible to provide the same advantage as the fourth exemplary embodiment.

Eighth Exemplary Embodiment

The description of an eighth exemplary embodiment in which the present invention is preferably embodied will be provided. FIG. 18 is a perspective view of an optical transmission unit according to the present embodiment.

The optical transmission unit according to the present embodiment has the contact portion extended toward a lower side thereof similar to the third exemplary embodiment but is different from the optical transmission unit according to the third exemplary embodiment, in that the shape serving as the bonging portion is provided for the first carrier 117.

Even with such a configuration, it is possible to provide the same advantage as the third exemplary embodiment.

Ninth Exemplary Embodiment

The description of a ninth exemplary embodiment in which the present invention is preferably embodied will be provided. FIG. 19 is a perspective view of an optical transmission unit according to the present embodiment.

The optical transmission unit according to the present embodiment has the contact portion extended toward both upper and lower sides thereof similar to the fifth exemplary embodiment but is different from the optical transmission unit according to the fifth exemplary embodiment, in that the shape serving as the bonging portion is provided for the first carrier 117.

Even with such a configuration, it is possible to provide the same advantage as the fifth exemplary embodiment.

The embodiments described above are merely examples of preferred embodiments of the present invention, and therefore, the present invention is not limited to these embodiments and various modifications can be made to these embodiments.

DESCRIPTION OF REFERENCE NUMERALS

Figure 1:
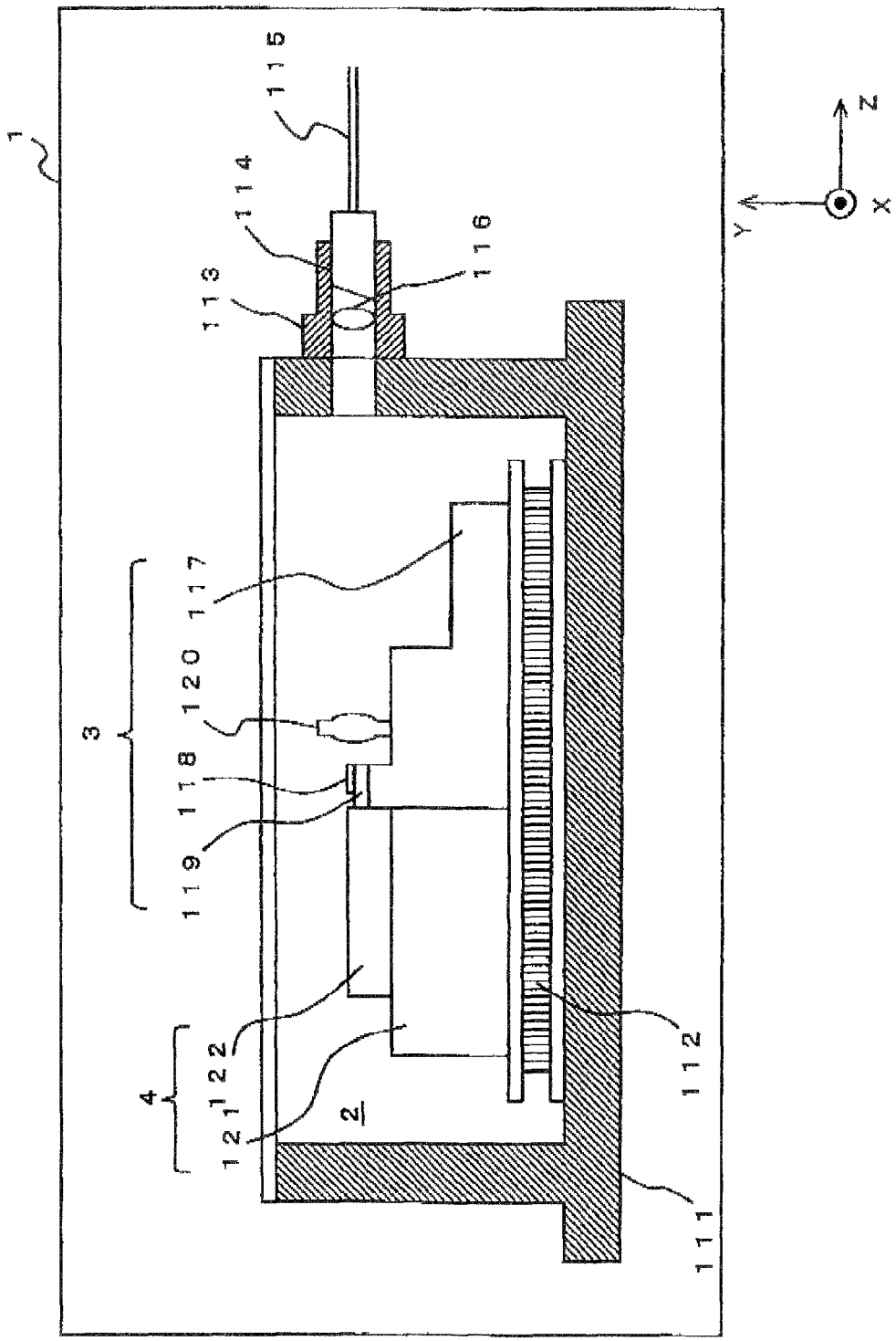
FIG. 1 is a cross-sectional view illustrating a structure of an optical transmission module according to a first exemplary embodiment, in which the present invention is preferably embodied.
Figure 2:
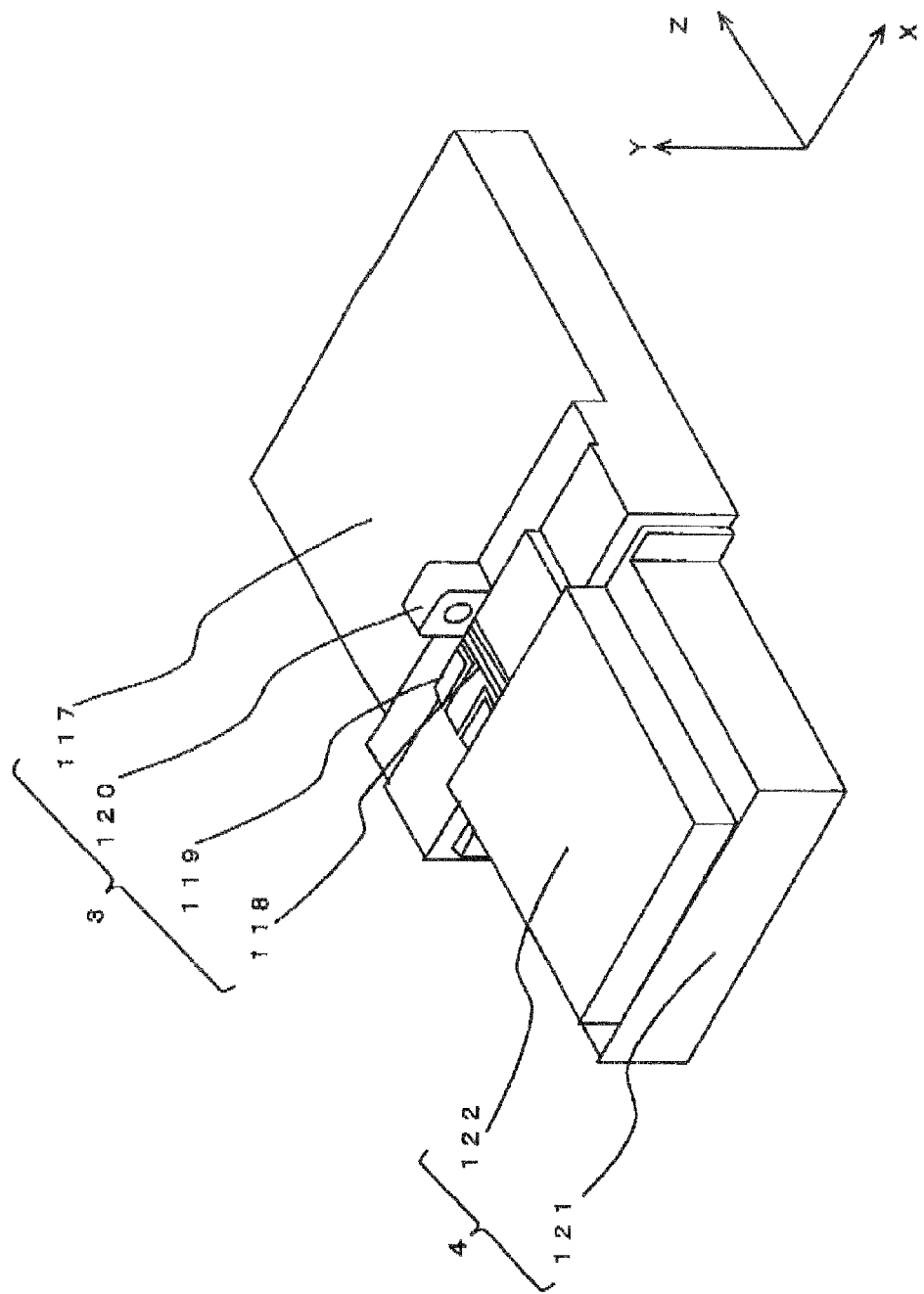
FIG. 2 is a perspective view illustrating a structure of, an optical transmission unit to be applied to the optical transmission module according to the first exemplary embodiment.
Figure 3:
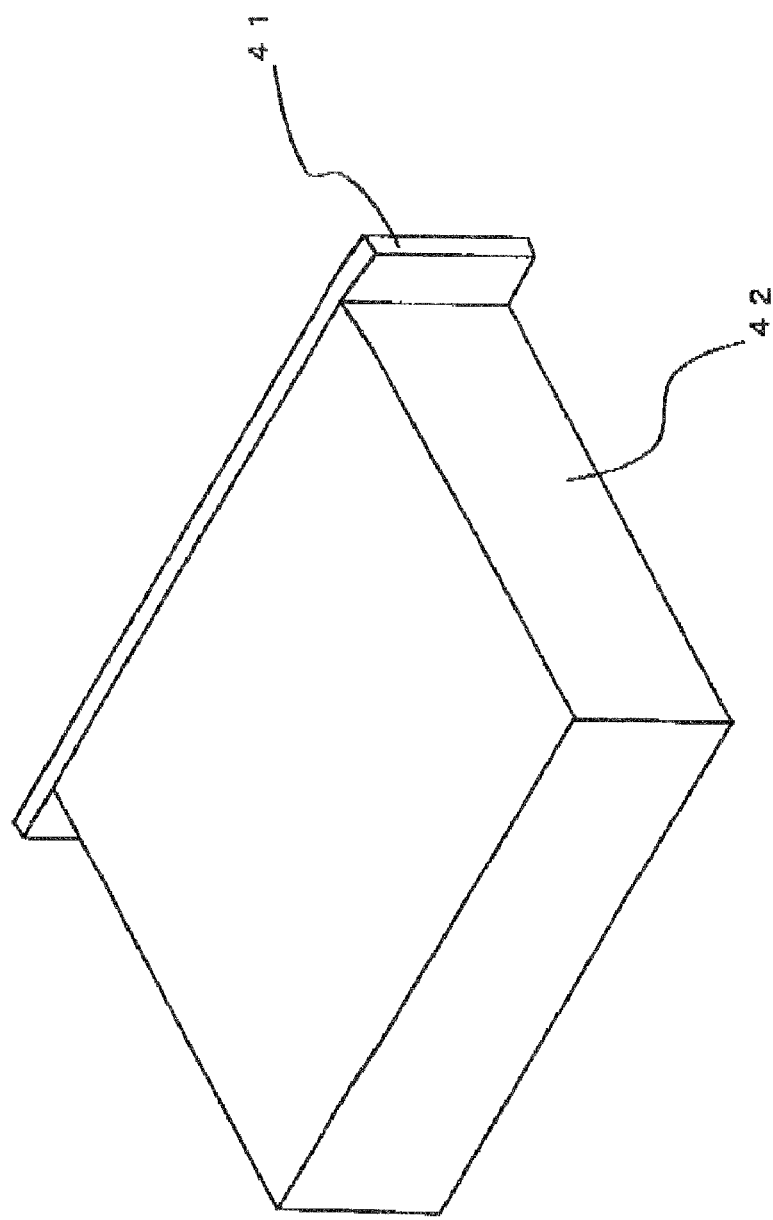
FIG. 3 is a view illustrating a structure of a second carrier made of a composite material.
Figure 4:
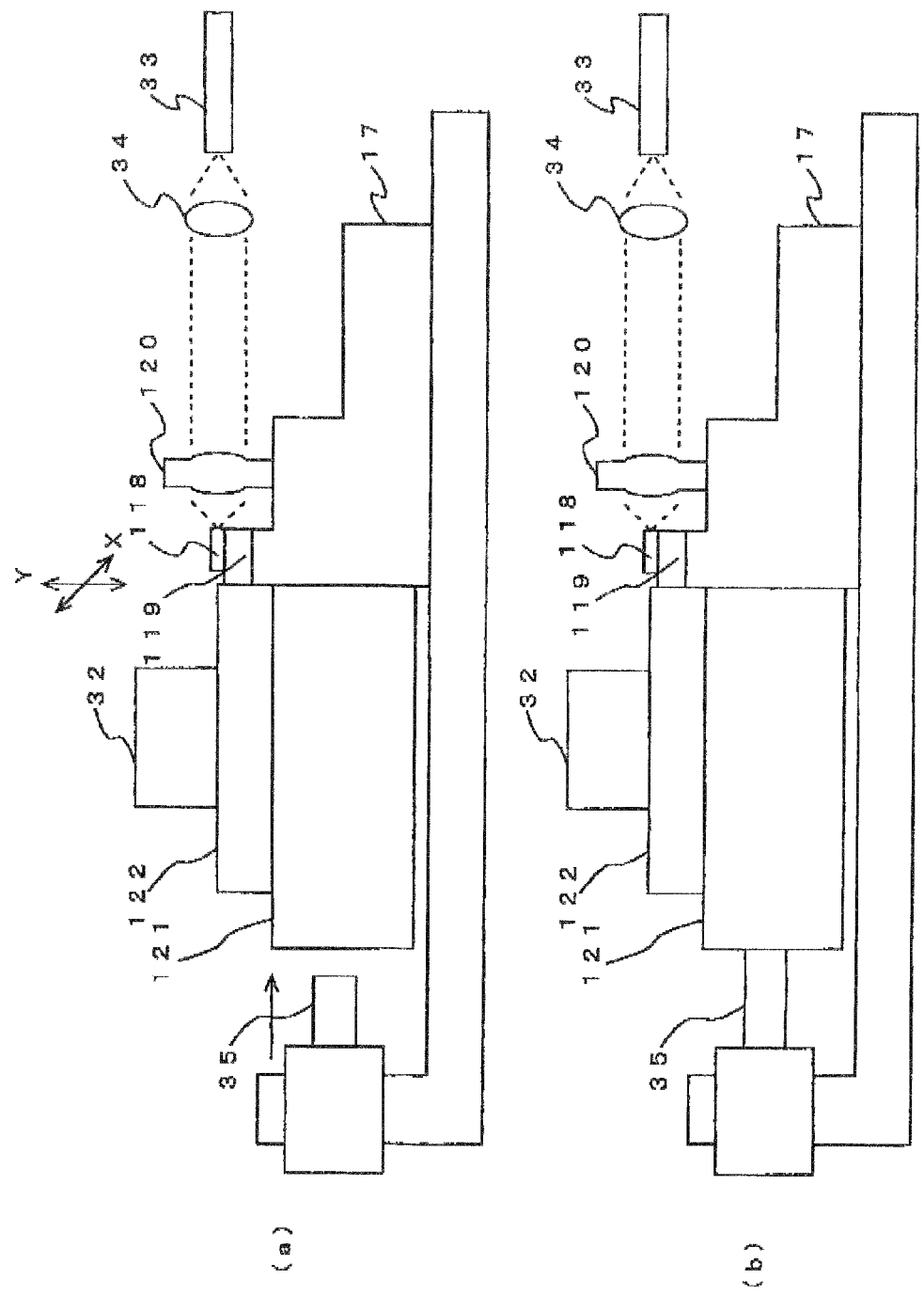
FIG. 4 is a view illustrating a method of fixing a first optical device unit on a second optical device unit 4.
Figure 5:
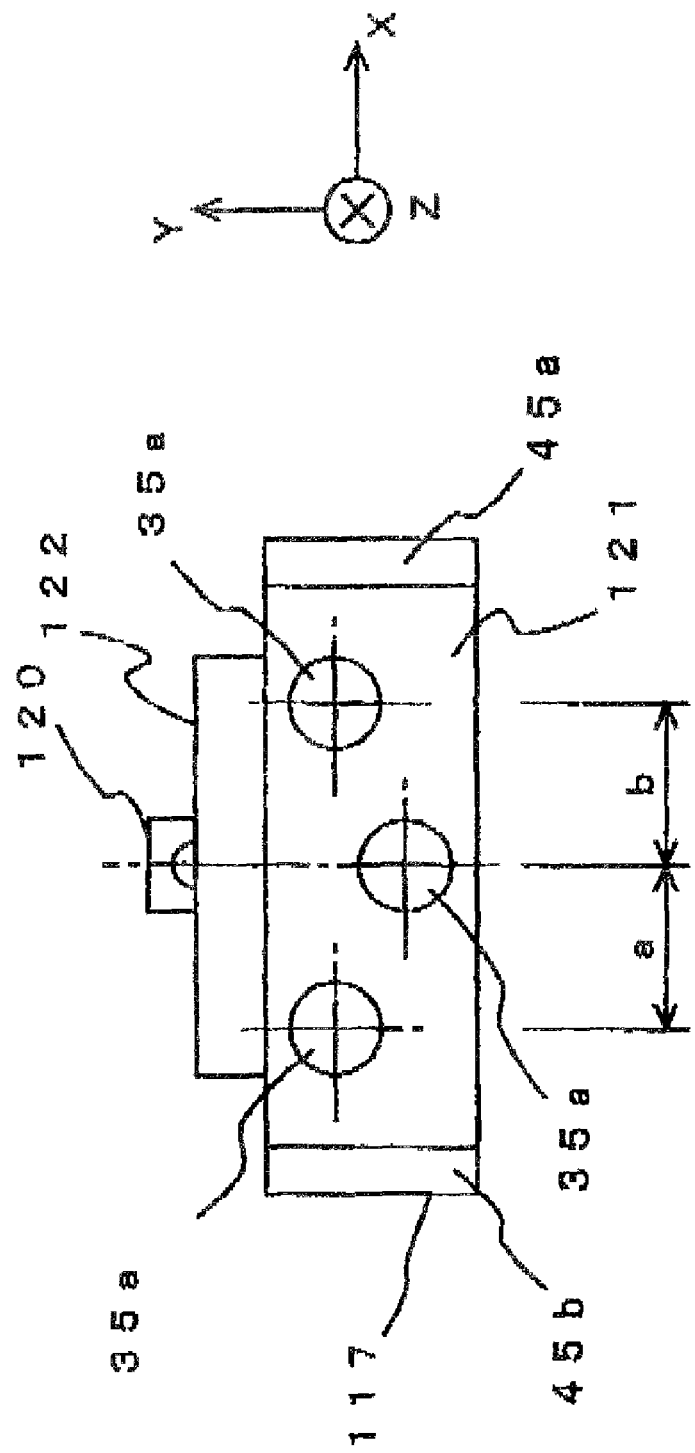
FIG. 5 is a view illustrating an area which is pressed by a pusher.
Figure 6:
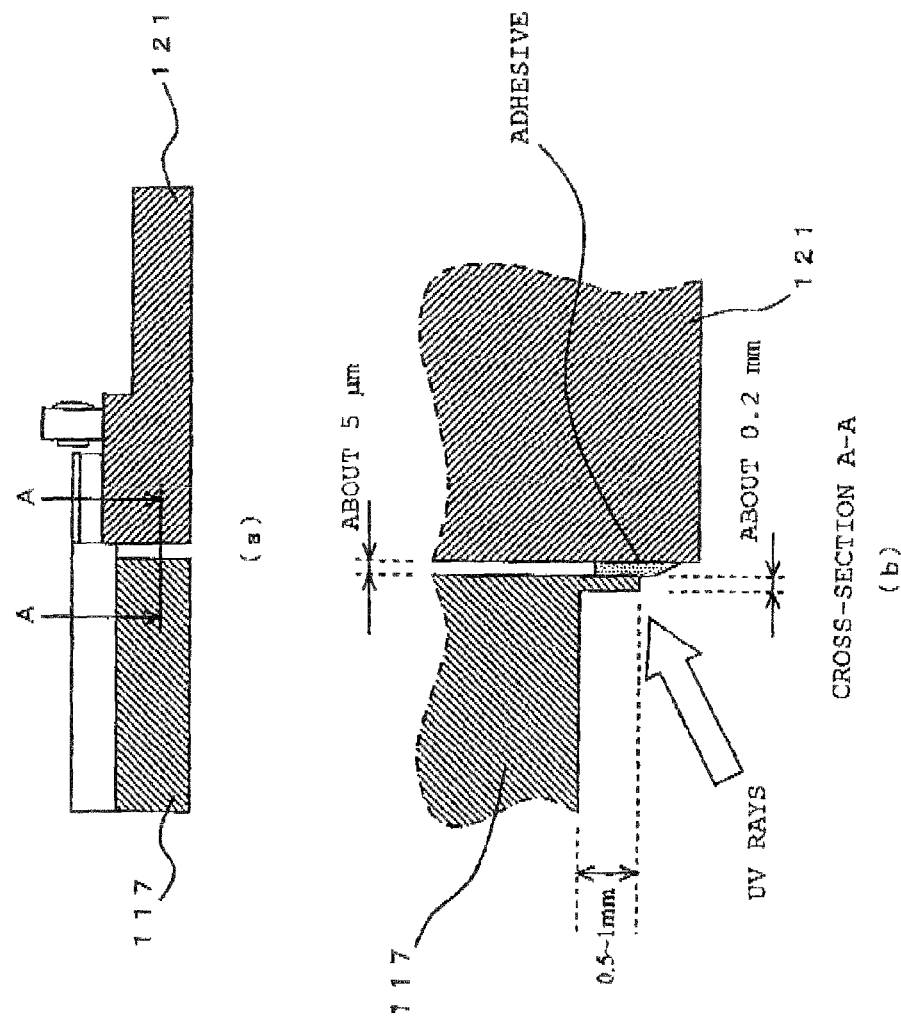
FIG. 6 is a view illustrating the position of a bonding portion.
Figure 7:
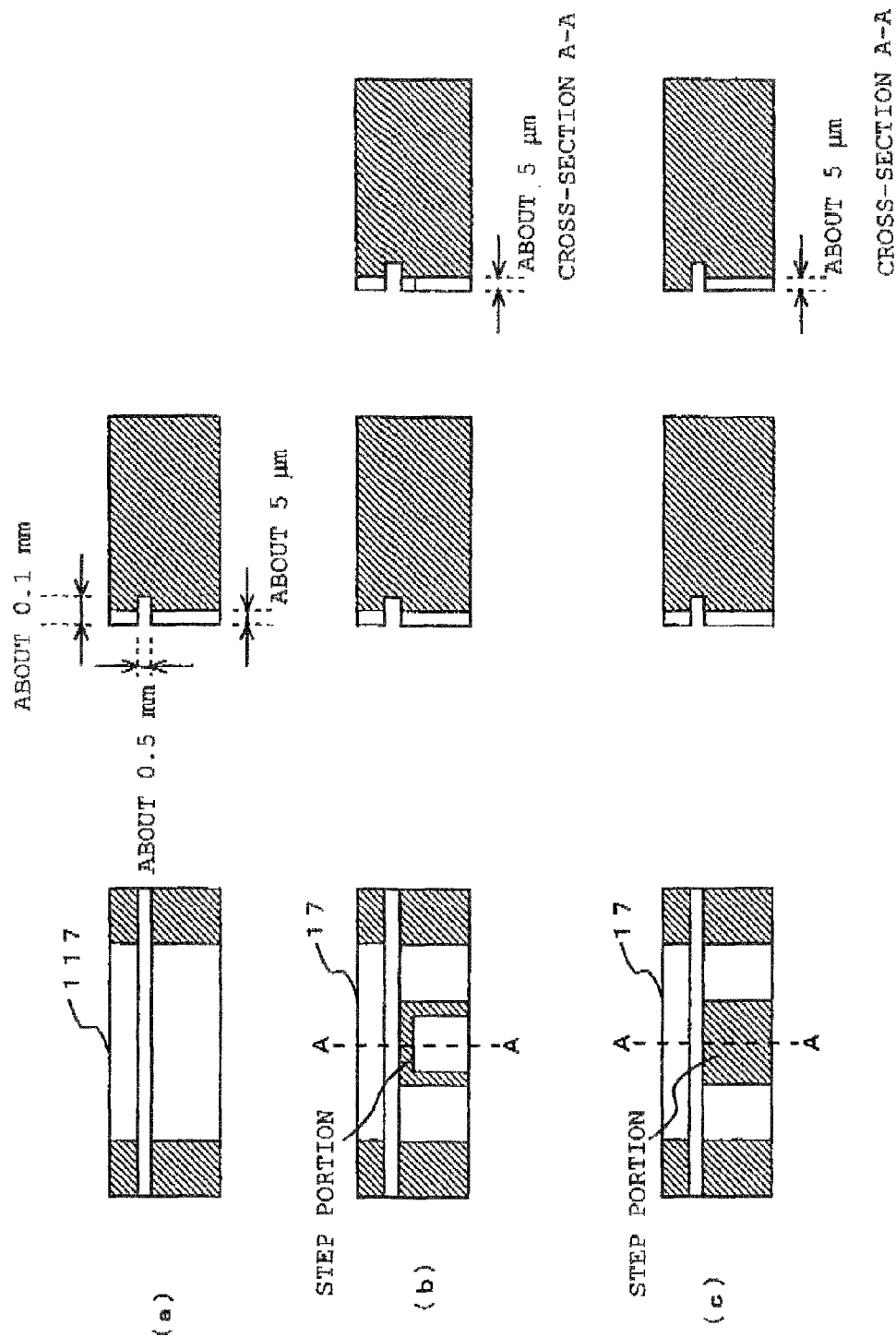
FIG. 7 is a view illustrating the cross-sectional shape of a first carrier.
Figure 8:
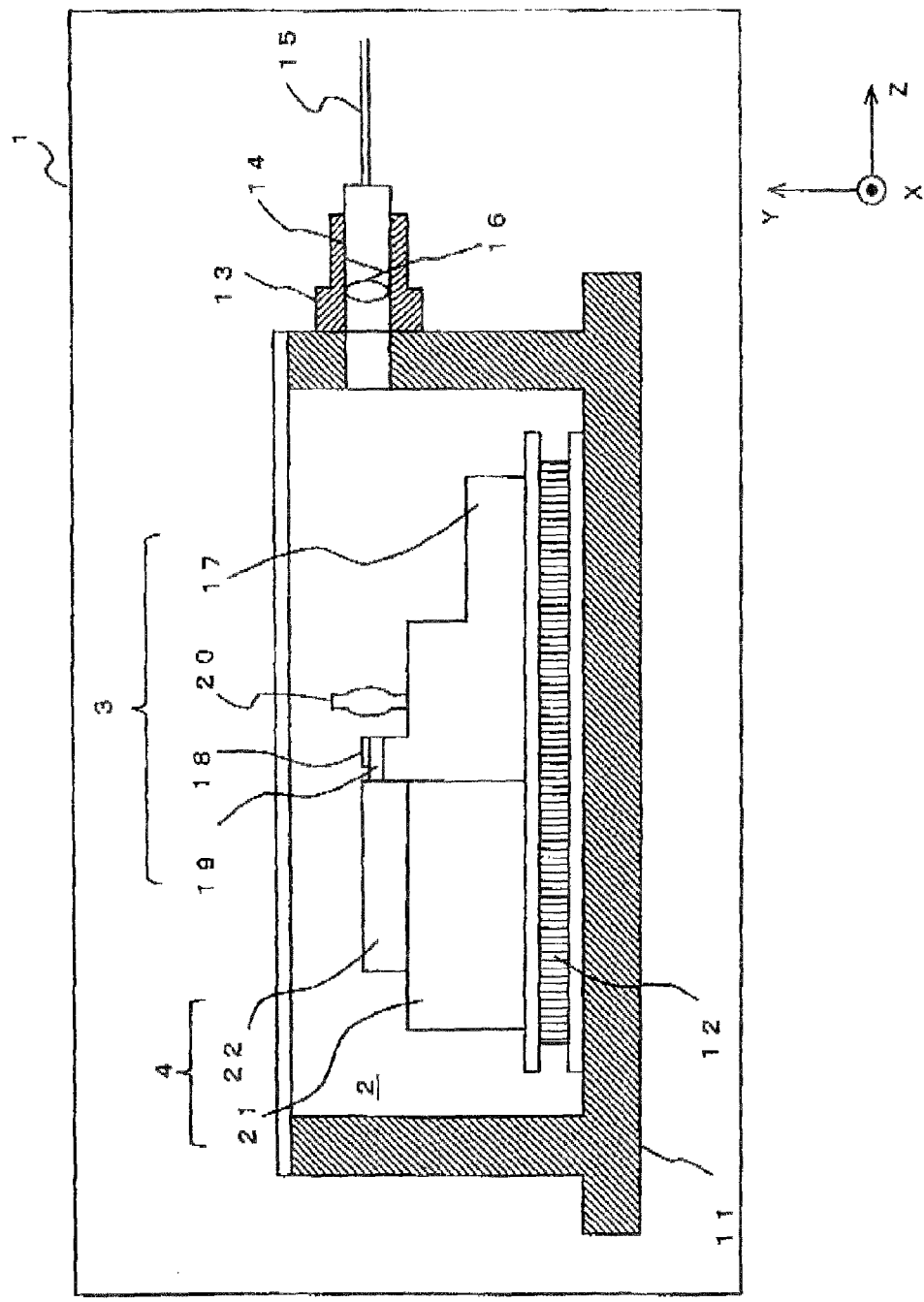
FIG. 8 is a view illustrating an example structure of an optical transmission module according to the first exemplary embodiment.
Figure 9:
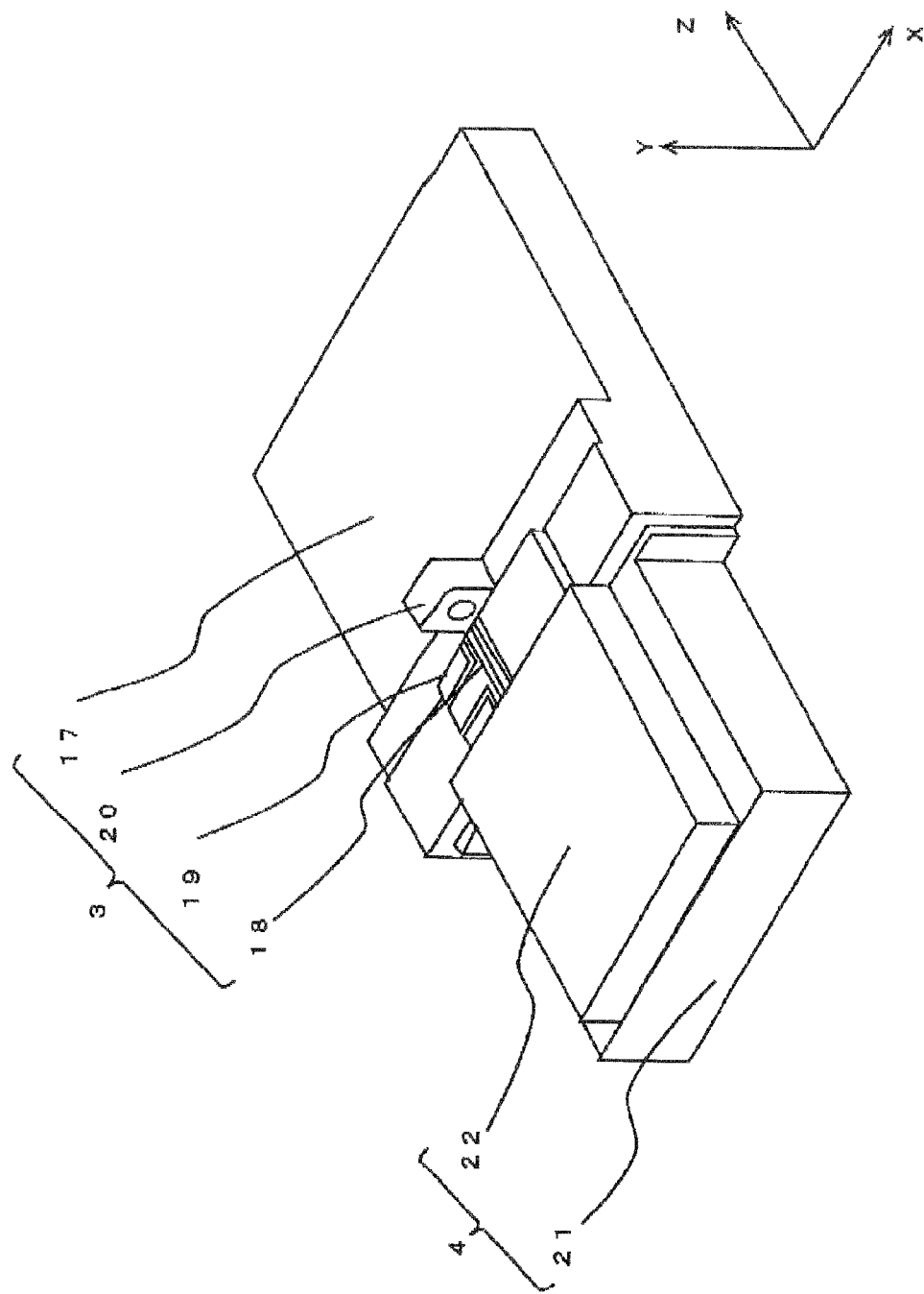
FIG. 9 is a view illustrating an example structure of an optical transmission unit to be applied to the optical transmission module according to the first exemplary embodiment.
Figure 10:
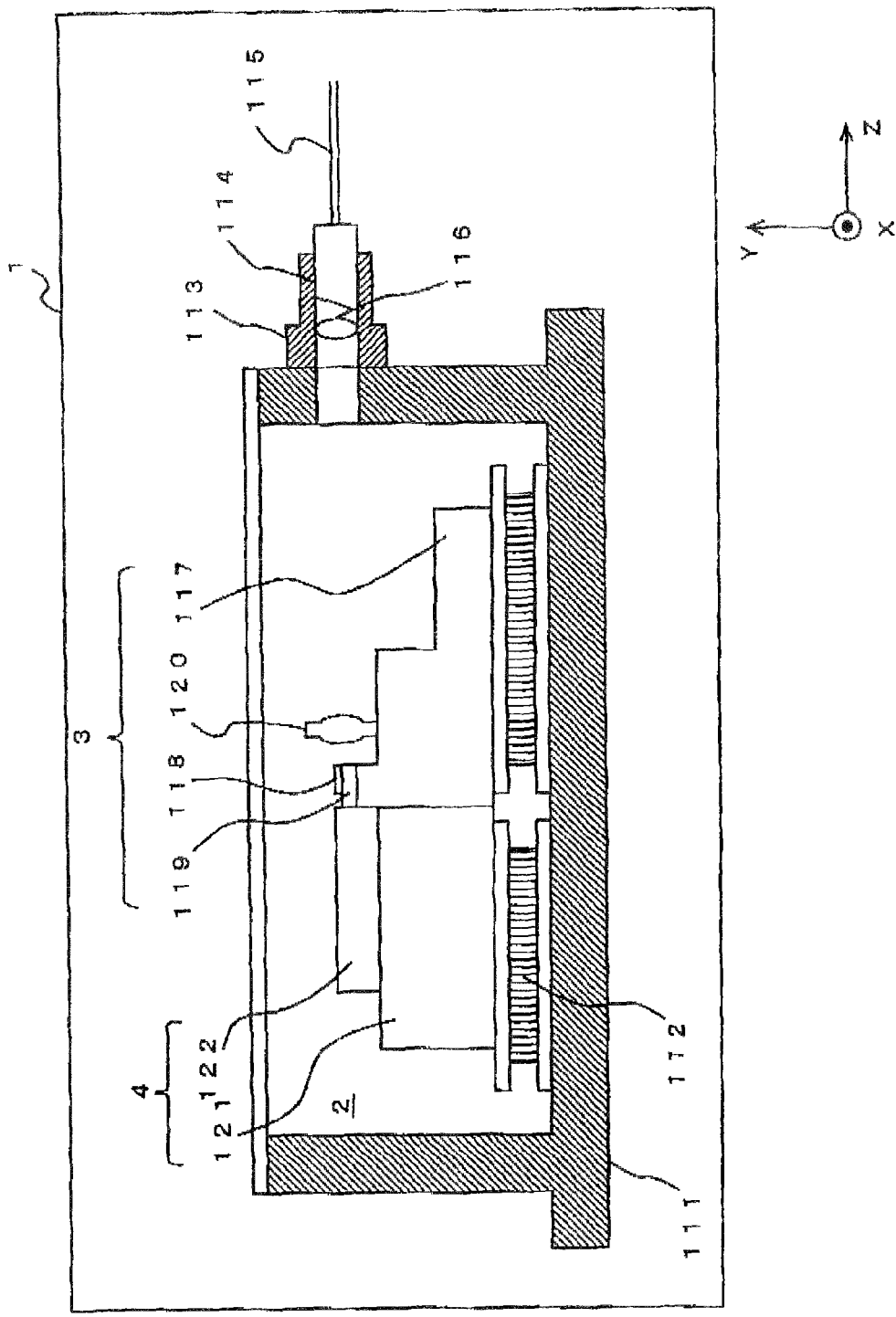
FIG. 10 is a cross-sectional view illustrating a structure of an optical transmission module according to a second exemplary embodiment in which the present invention is preferably embodied.
Figure 11:
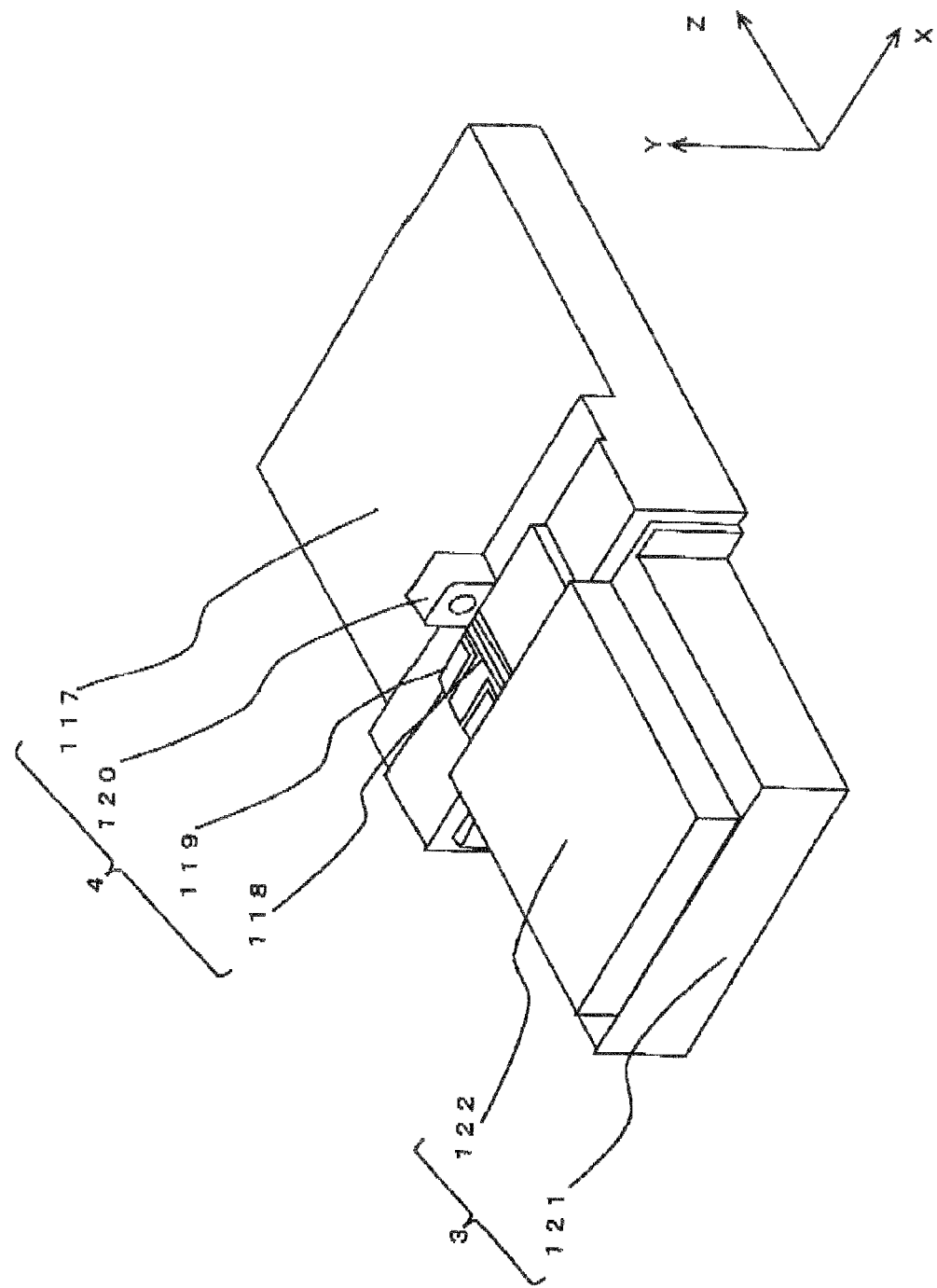
FIG. 11 is a perspective view illustrating a structure of an optical transmission unit to be applied to the optical transmission module according to the second exemplary embodiment.
Figure 12:
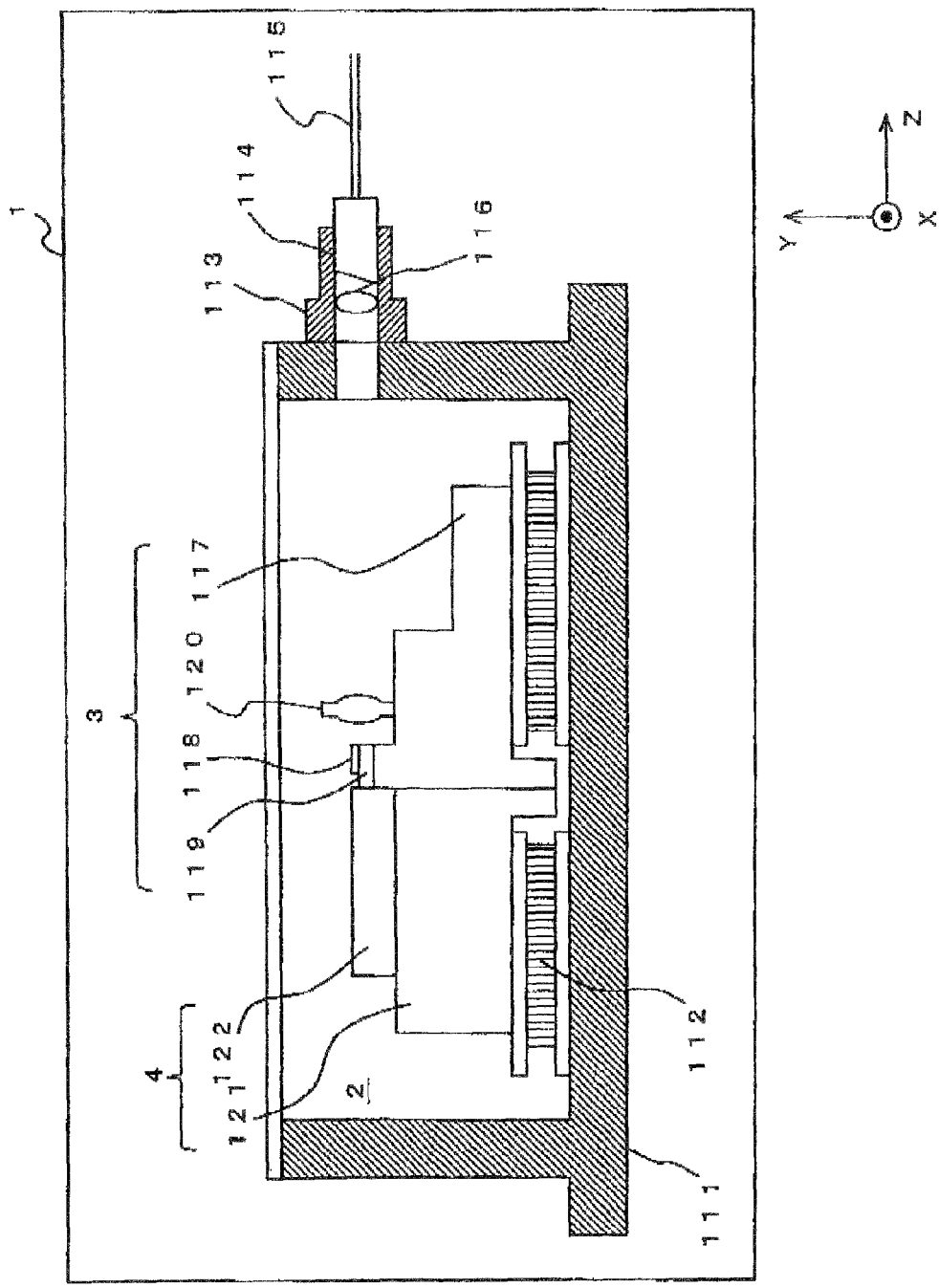
FIG. 12 is a cross-sectional view illustrating a structure of an optical transmission module according to a third exemplary embodiment in which the present invention is preferably embodied.
Figure 13:
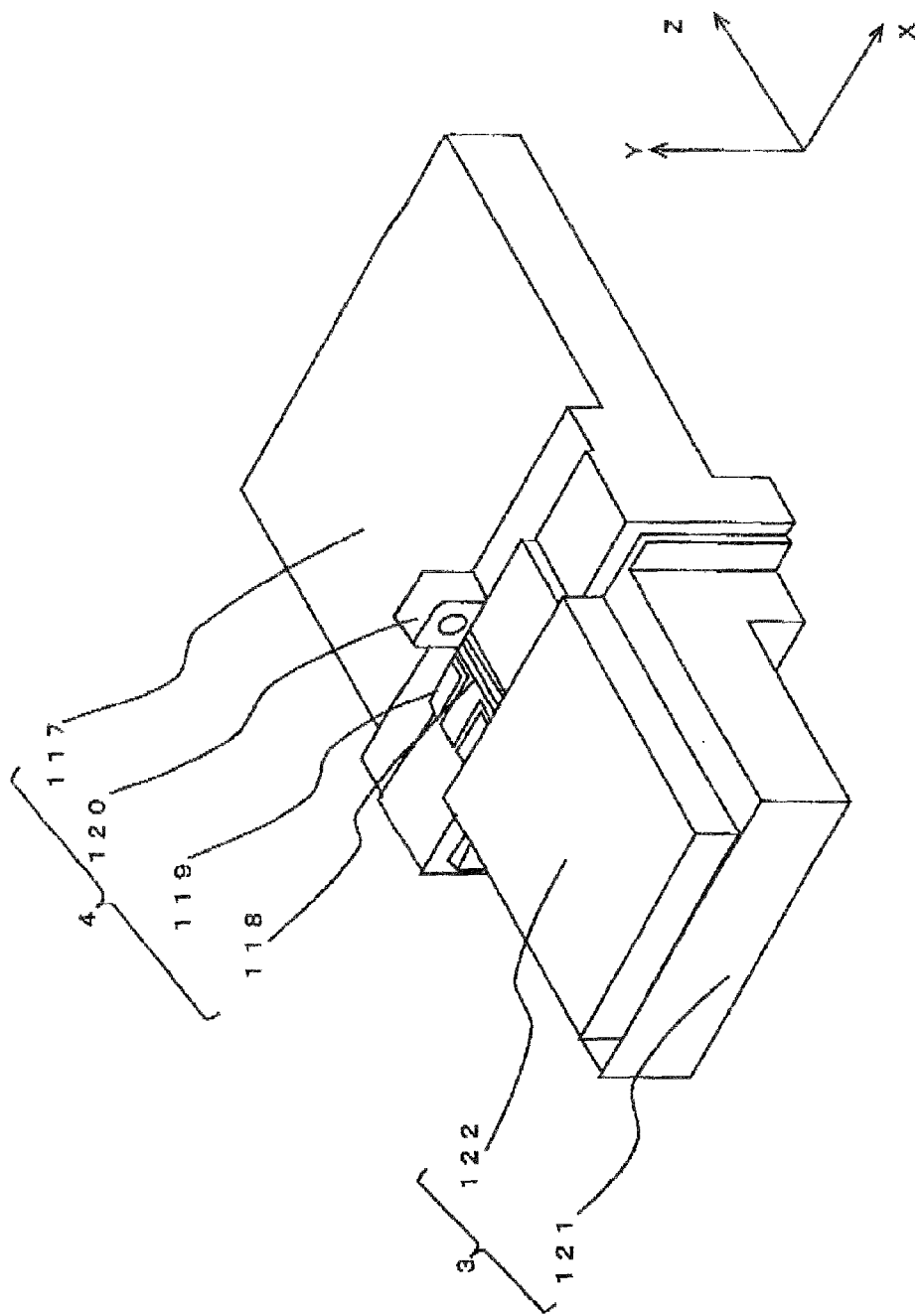
FIG. 13 is a perspective view illustrating a structure of an optical transmission unit to be applied to the optical transmission module according to the third exemplary embodiment.
Figure 14:
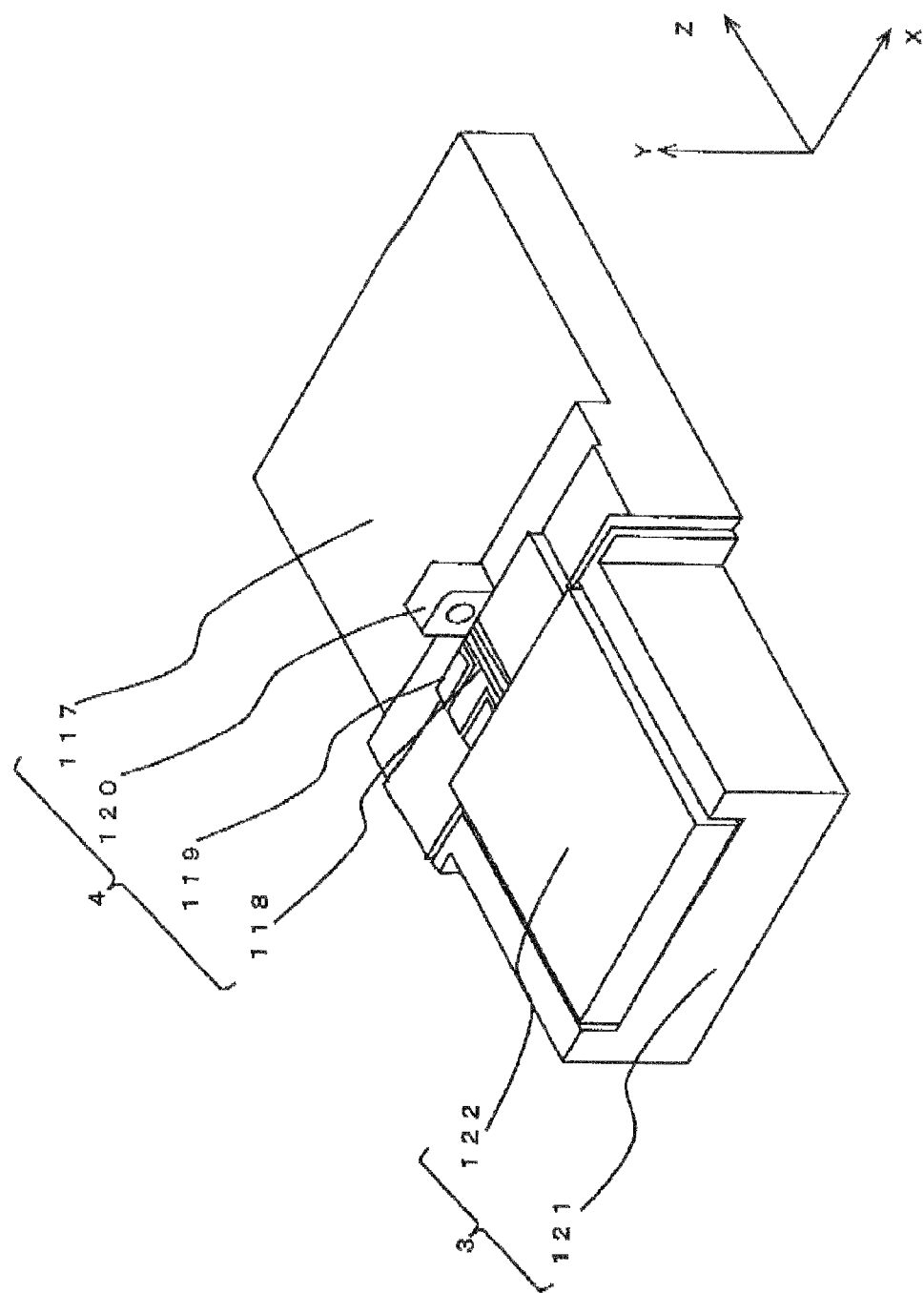
FIG. 14 is a perspective view illustrating a structure of an optical transmission unit to be applied to an optical transmission module according to a fourth exemplary embodiment in which the present invention is preferably embodied.
Figure 15:
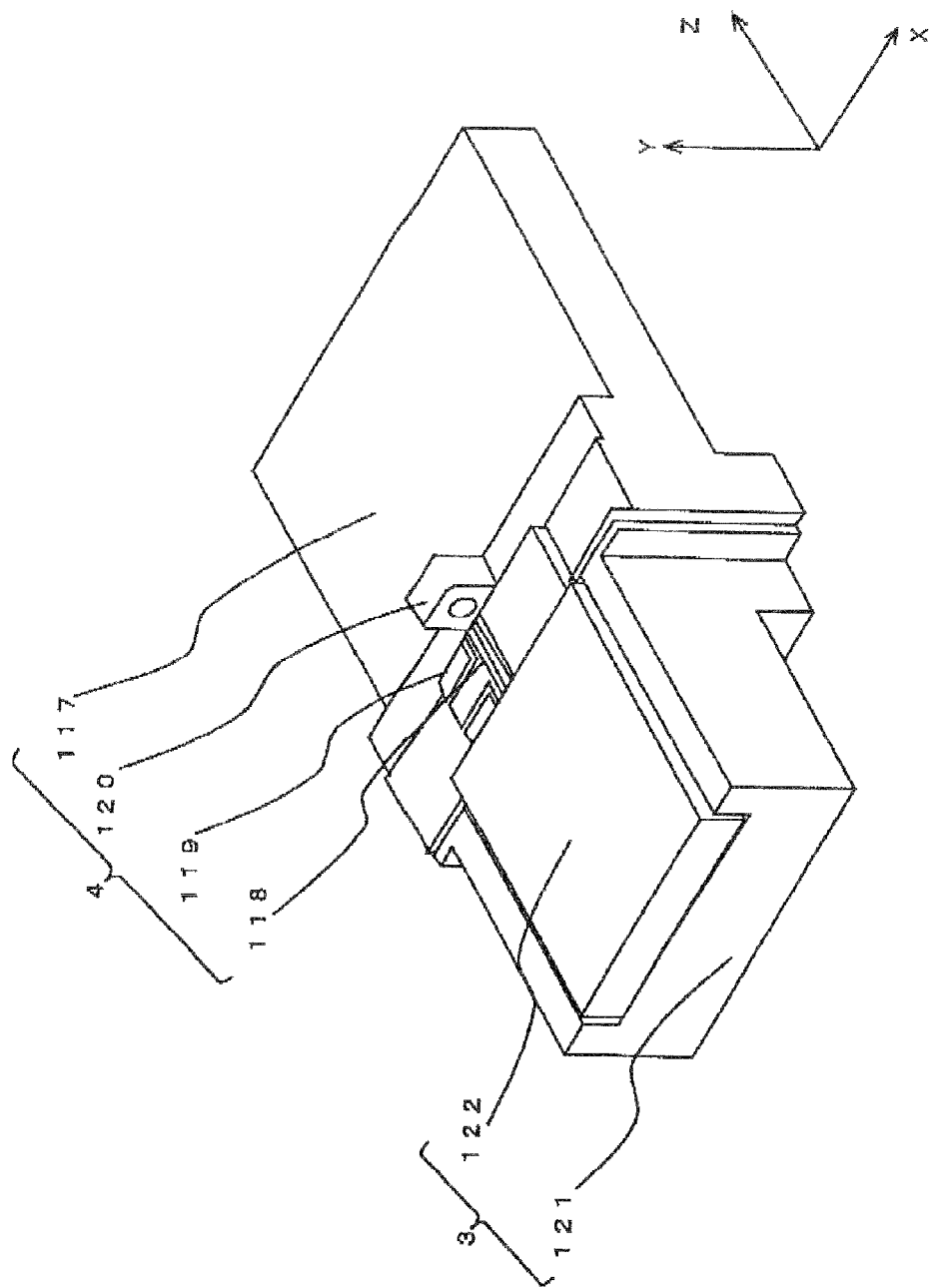
FIG. 15 is a perspective view illustrating a structure of an optical transmission unit to be applied to an optical transmission module according to a fifth exemplary embodiment in which the present invention is preferably embodied.
Figure 16:
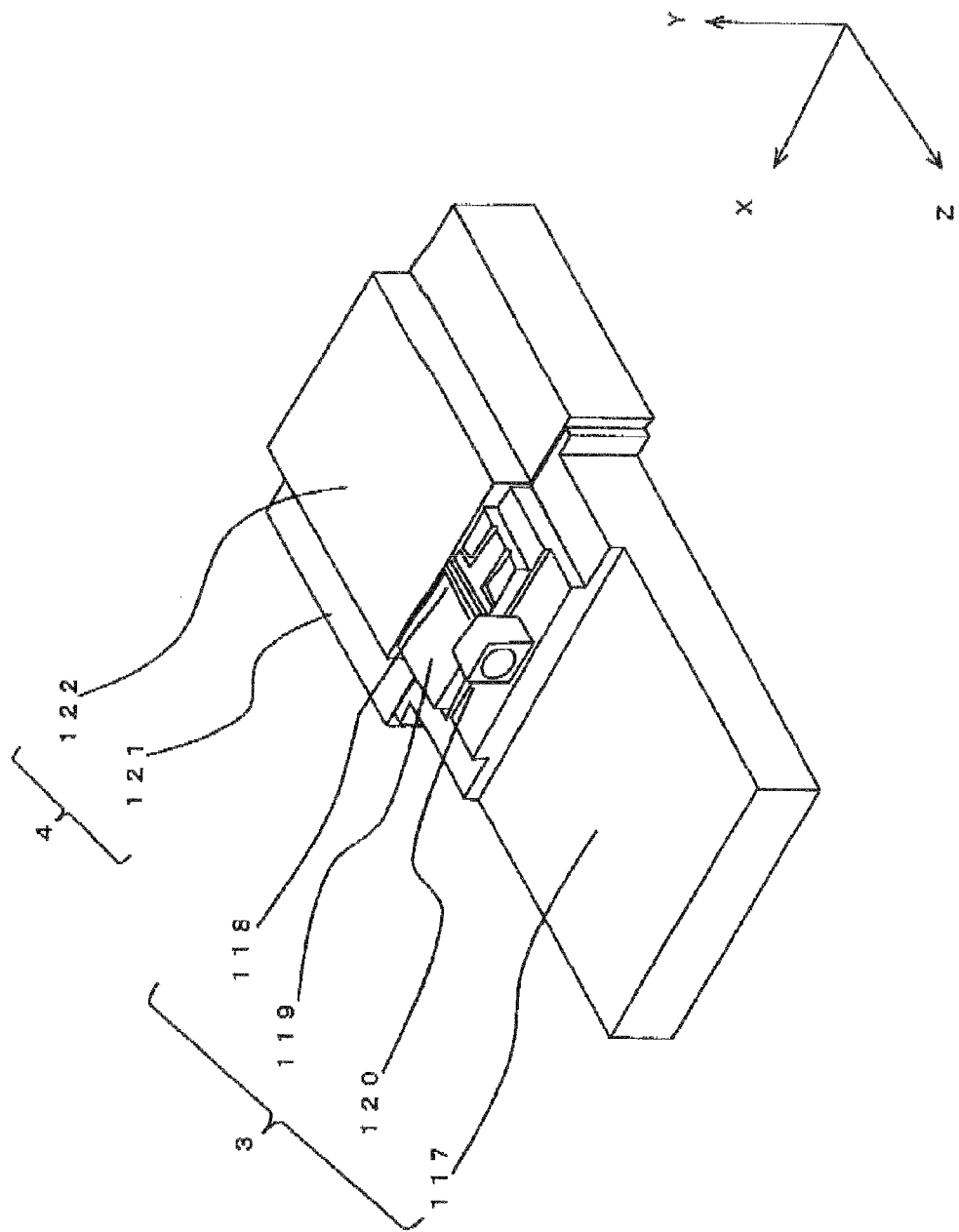
FIG. 16 is a perspective view illustrating a structure of an optical transmission unit to be applied to an optical transmission module according to a sixth exemplary embodiment in which the present invention is preferably embodied.
Figure 17:
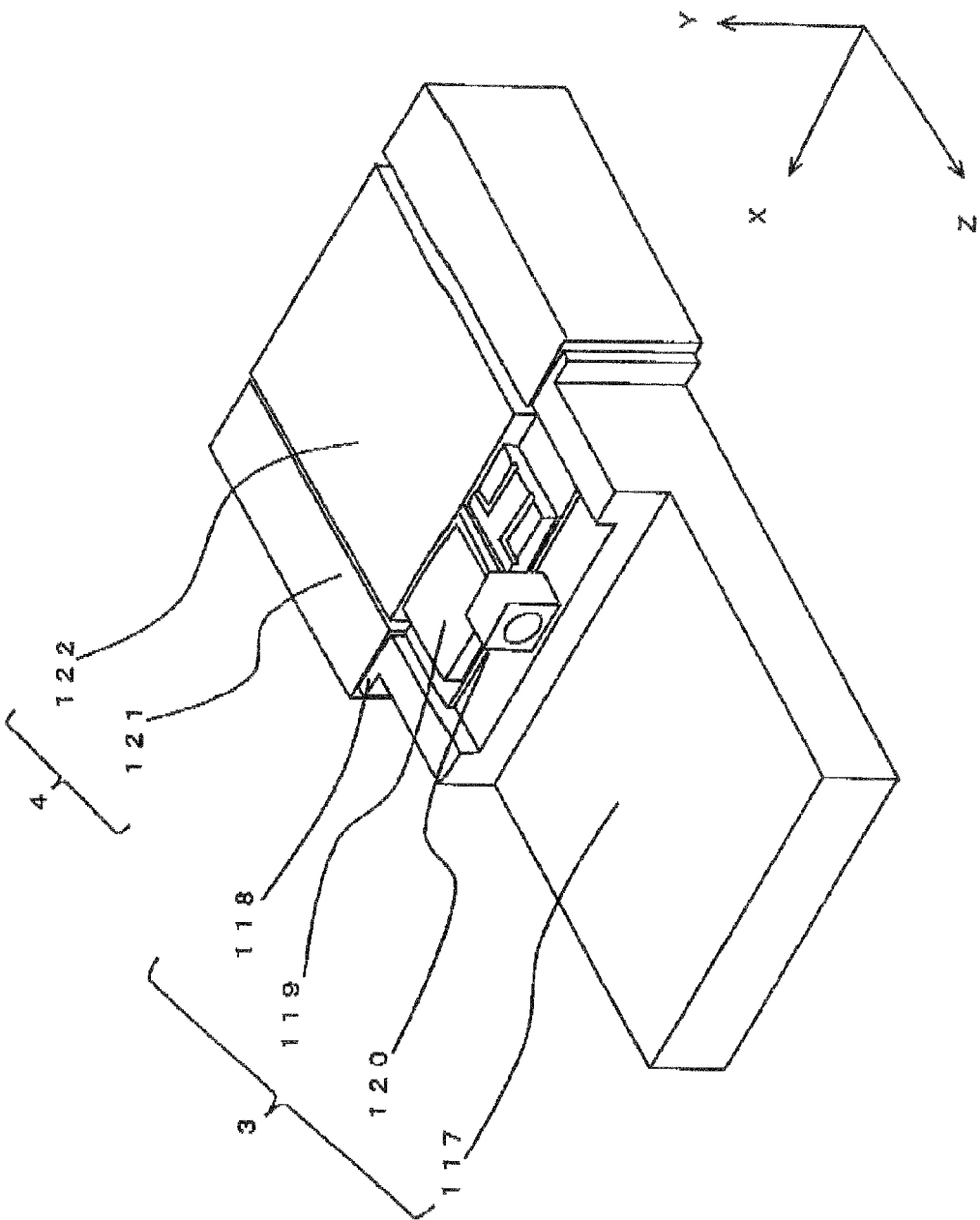
FIG. 17 is a perspective view illustrating a structure of an optical transmission unit to be applied to an optical transmission module according to a seventh exemplary embodiment in which the present invention is preferably embodied.
Figure 18:
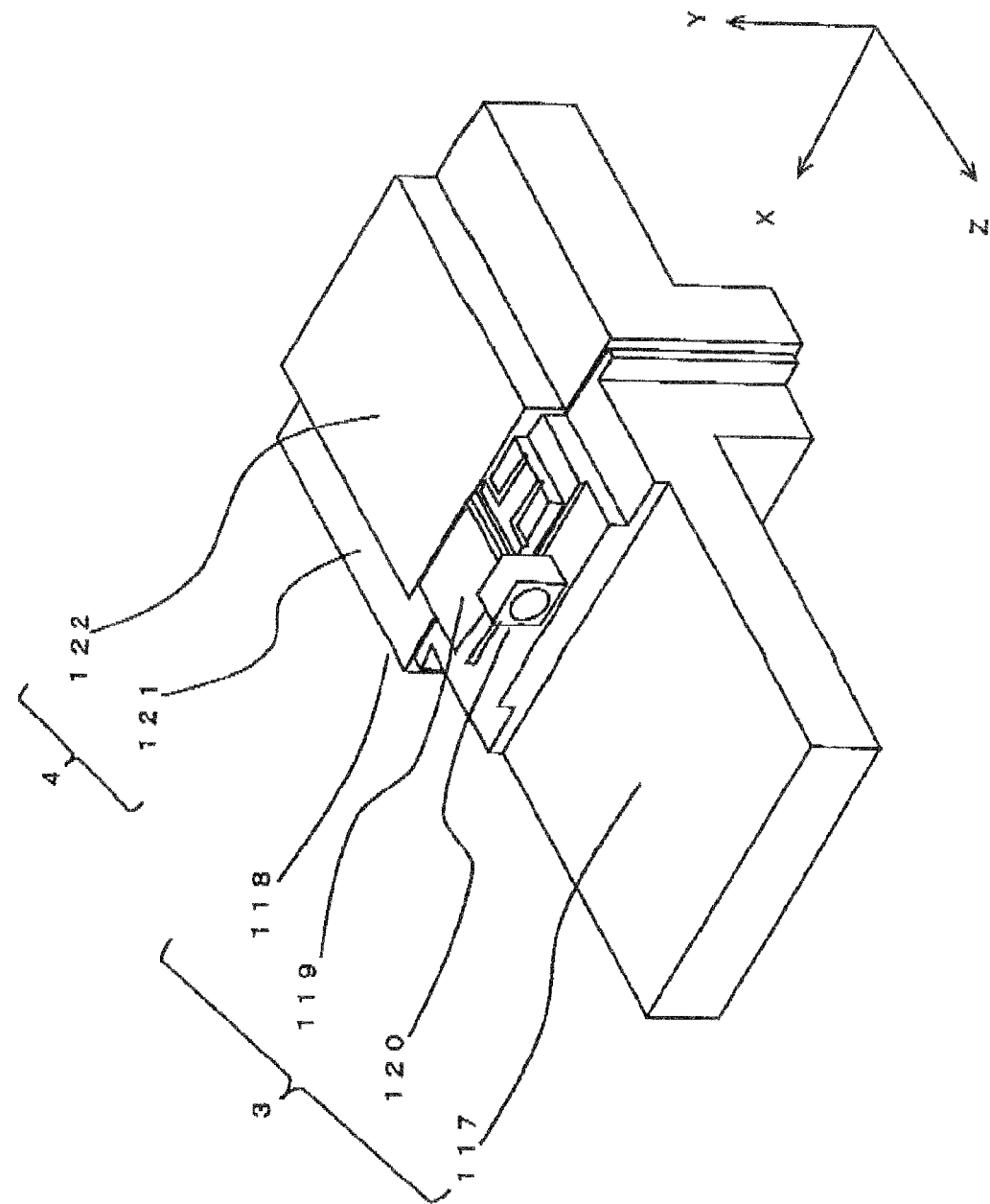
FIG. 18 is a perspective view illustrating a structure of an optical transmission unit to be applied to an optical transmission module according to an eighth exemplary embodiment in which the present invention is preferably embodied.
Figure 19:
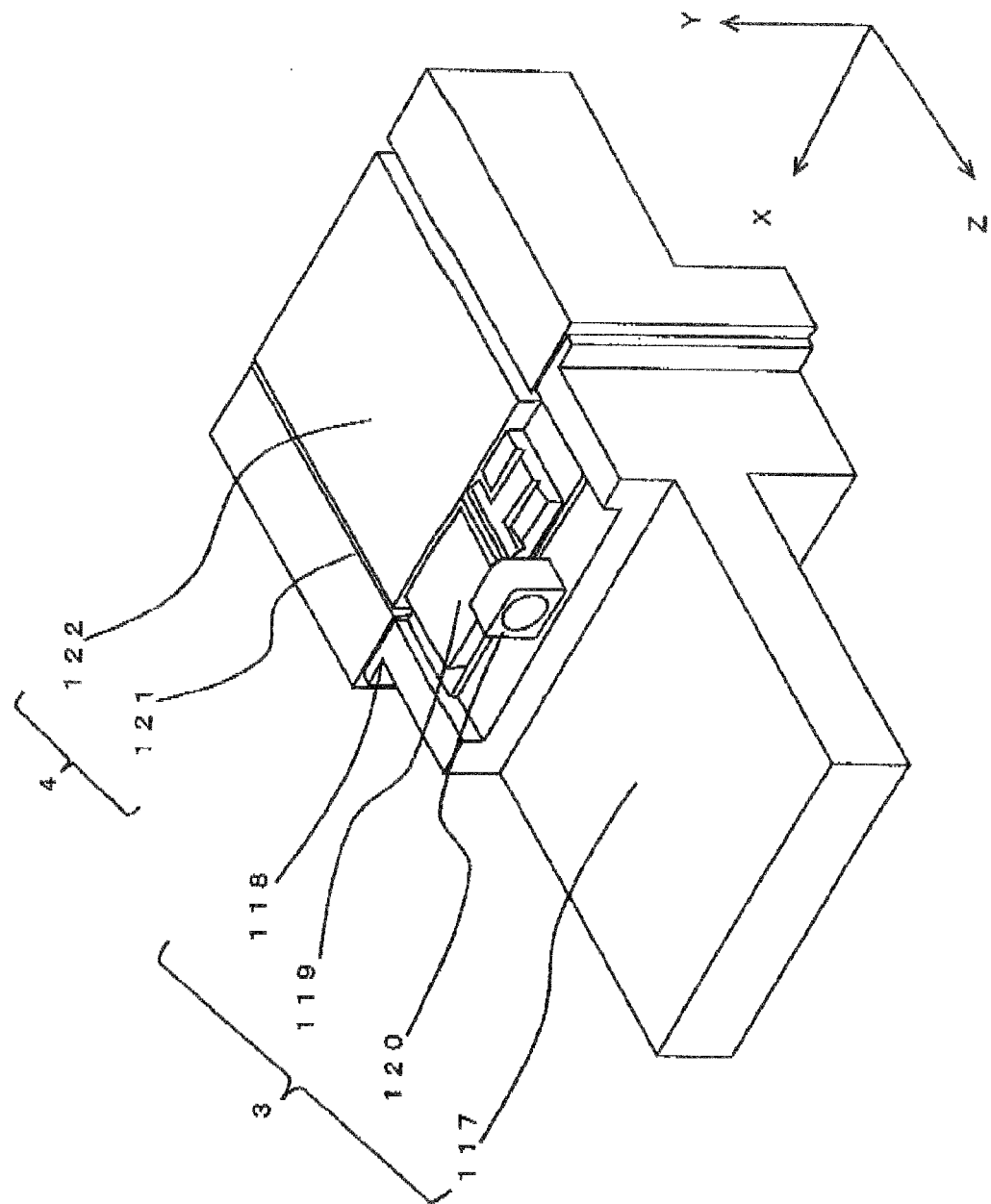
FIG. 19 is a perspective view illustrating a structure of an optical transmission unit to be applied to an optical transmission module according to a ninth exemplary embodiment in which the present invention is preferably embodied.

1: optical transmission module
2: optical transmission unit
3: first optical device unit
4: second optical device unit
11, 111: package
12, 12a, 112,112a: peltier element
13, 113: fiber support
14, 114: ferrule
15, 33, 115: optical fiber
16, 116: coupling lens
17, 117: first carrier
18: semiconductor optical amplifier
19, 119: first sub-carrier
20: rectangular aspheric lens
21, 121: second carrier
22: planar lightwave circuit
32: grasping tool
34: fiber coupling lens
35: pusher
35a: pressing area
41: ultraviolet irradiation portion
42: ultraviolet non-irradiation portion
118: first optical device
120: lens
122: second optical device

The invention claimed is:

1. An optical transmission module, comprising:
a first optical device placed on an output side thereof;
a second optical device placed on the first optical device disposed with an optical axis of the second optical device aligned with an optical axis of the first optical device;
a first carrier secured to the first optical device via a first sub-carrier; and
a second carrier secured to the second optical device,
the first carrier in close contact with and closely secured to the second carrier on a surface perpendicular to the optical axis of the second carrier,
the second carrier being a material having good thermal conductivity and ultraviolet transmitting properties.

2. The optical transmission module according to claim 1, wherein the first and second carriers are fixed on the same peltier element.

3. The optical transmission module according to claim 1, wherein the first and second carriers are fixed on each peltier element.

4. The optical transmission module according to claim 1, wherein thin wall portions are provided for a portion of the second carrier in close contact with the first carrier.

5. The optical transmission module according to claim 4, wherein the fixing the first carrier on the second carrier is made on the thin wall portions.

6. The optical transmission module according to claim 5, wherein one of an opening and a concave is provided for the second carrier to form each of the thin wall portions.

7. The optical transmission module according to claim 1, wherein the first carrier is fixed to the second carrier by a weld.

8. The optical transmission module according to claim 1, wherein the first carrier is fixed to the second carrier by a bond.

9. The optical transmission module according to claim 8, wherein the first carrier is fixed to the second carrier by an ultraviolet curable adhesive.

10. The optical transmission module according to claim 1, wherein the first carrier is fixed to the second carrier by a braze.

11. The optical transmission module according to claim 1, wherein the first optical device is a semiconductor optical amplifier to amplify an incident signal light.

12. The optical transmission module according to claim 1, wherein the second optical device is a planar lightwave circuit.

13. The optical transmission module according to claim 1, wherein,
a bonding surface of the first carrier is in the close contact with and closely secured to a bonding surface of the second carrier, and
the second carrier is made of a composite material containing a plurality of materials, the bonding surface of the second carrier being made of a material having excellent ultraviolet transmittance and another portion of the second carrier being made of a material having good thermal conductivity.

14. The optical transmission module according to claim 1, wherein, a bonding surface of the first carrier is in the close contact with and closely secured to a bonding surface of the second carrier, and the first carrier is made of a composite material containing a plurality of materials, the bonding surface of the first carrier being a material having ultraviolet reflection efficiency and another portion of the first carrier being made of a material having good thermal conductivity.

15. The optical transmission module according to claim 1, wherein the second carrier is a material including aluminum nitride-based translucent ceramics.

16. The optical transmission module according to claim 13, wherein the material having excellent ultraviolet transmittance is glass, and the material having good thermal conductivity is one of copper tungsten and aluminum nitride.

17. The optical transmission module according to claim 14, wherein the material having ultraviolet reflection efficiency is glass, and the material having good thermal conductivity is gold plating.

* * * * *